(12) United States Patent
Tei

(10) Patent No.: US 12,341,313 B2
(45) Date of Patent: Jun. 24, 2025

(54) GAS LASER APPARATUS, LASER BEAM EMITTING METHOD OF GAS LASER APPARATUS, AND ELECTRONIC DEVICE MANUFACTURING METHOD

(71) Applicant: Gigaphoton Inc., Tochigi (JP)

(72) Inventor: Daisuke Tei, Oyama (JP)

(73) Assignee: Gigaphoton Inc., Tochigi (JP)

(\*) Notice: Subject to any disclaimer, the term of this patent is extended or adjusted under 35 U.S.C. 154(b) by 873 days.

(21) Appl. No.: 17/371,930

(22) Filed: Jul. 9, 2021

(65) Prior Publication Data

US 2021/0336403 A1    Oct. 28, 2021

Related U.S. Application Data

(63) Continuation of application No. PCT/JP2019/006241, filed on Feb. 20, 2019.

(51) Int. Cl.
*H01S 3/036* (2006.01)
*G03F 7/00* (2006.01)
(Continued)

(52) U.S. Cl.
CPC .......... *H01S 3/036* (2013.01); *G03F 7/70025* (2013.01); *H01S 3/034* (2013.01); *H01S 3/0346* (2013.01); *H01S 3/038* (2013.01)

(58) Field of Classification Search
CPC ......... H01S 3/036; H01S 3/034; H01S 3/0346
See application file for complete search history.

(56) References Cited

U.S. PATENT DOCUMENTS 3,810,044 A \* 5/1974 Woodbury .............. H01S 3/042
372/33
5,001,873 A \* 3/1991 Rufin .................... H01S 3/0346
451/39
(Continued)

FOREIGN PATENT DOCUMENTS

CN    107204561 A \* 9/2017 ........... H01S 3/0346
CN    107925211 A    4/2018
(Continued)

OTHER PUBLICATIONS

A Search Report issued by China National Intellectual Property Administration on May 11, 2023, in Chinese Patent Application No. 201980088640.3, and is related to U.S. Appl. No. 17/371,930; with English language translation.
(Continued)

*Primary Examiner* — Joshua King
(74) *Attorney, Agent, or Firm* — Studebaker Brackett PLLC

(57) ABSTRACT

A gas laser apparatus includes a chamber; a window provided in the chamber; an optical path tube connected to the chamber; a gas supply port that supplies a purge gas into the optical path tube; an exhaust port that exhausts a gas in the optical path tube; and a control unit, the exhaust port including a main exhaust port provided in the optical path tube, and an auxiliary exhaust port provided in the optical path tube upstream of a flow of the gas in the optical path tube with respect to positions of the window and the main exhaust port, the control unit causing the gas to be exhausted through the main exhaust port before a laser beam is emitted from the chamber and causing the gas to be exhausted through the auxiliary exhaust port in at least a partial period when the laser beam is emitted.

10 Claims, 11 Drawing Sheets

(51) Int. Cl.
*H01S 3/034* (2006.01)
*H01S 3/038* (2006.01)

(56) References Cited

U.S. PATENT DOCUMENTS

| | | | | |
|---|---|---|---|---|
| 5,237,583 A | * | 8/1993 | Brimacombe | H01S 3/086 372/99 |
| 5,825,801 A | * | 10/1998 | Nishida | B23K 26/0643 372/19 |
| 6,069,909 A | * | 5/2000 | Miller | H01S 3/034 372/59 |
| 6,219,368 B1 | * | 4/2001 | Govorkov | B23K 26/12 372/59 |
| 6,327,290 B1 | * | 12/2001 | Govorkov | G03F 7/70808 372/60 |
| 6,426,966 B1 | * | 7/2002 | Basting | H01S 3/08004 372/100 |
| 2001/0000606 A1 | * | 5/2001 | Gortler | B23K 26/123 219/121.84 |
| 2002/0021728 A1 | * | 2/2002 | Newman | H01S 3/223 372/55 |
| 2002/0034208 A1 | * | 3/2002 | Titus | H01S 3/0401 372/102 |
| 2002/0041617 A1 | * | 4/2002 | Itakura | H01S 3/225 372/59 |
| 2002/0105994 A1 | * | 8/2002 | Partlo | H01S 3/223 372/57 |
| 2002/0154668 A1 | * | 10/2002 | Knowles | G03F 7/70333 372/55 |
| 2002/0167986 A1 | * | 11/2002 | Pan | H01S 3/0385 372/55 |
| 2003/0142714 A1 | * | 7/2003 | Yamashita | H01S 3/2366 372/55 |
| 2004/0190578 A1 | * | 9/2004 | Partlo | H01S 3/036 372/55 |
| 2007/0171952 A1 | | 7/2007 | Kim | |
| 2014/0269794 A1 | * | 9/2014 | Murray | H01S 3/027 372/33 |
| 2015/0194784 A1 | * | 7/2015 | Kwon | H01S 3/0401 372/22 |
| 2016/0111846 A1 | * | 4/2016 | Mochiyama | B23K 26/0643 219/121.84 |
| 2016/0248214 A1 | | 8/2016 | Kurosu et al. | |
| 2018/0026414 A1 | | 1/2018 | Kurosu et al. | |
| 2018/0191122 A1 | | 7/2018 | Suzuki et al. | |
| 2018/0198253 A1 | * | 7/2018 | Miyamoto | H01S 3/08009 |
| 2018/0261973 A1 | | 9/2018 | Fujimaki et al. | |
| 2018/0351322 A1 | * | 12/2018 | Kurosawa | H01S 3/2316 |
| 2021/0367390 A1 | * | 11/2021 | Tei | G03F 7/70025 |

FOREIGN PATENT DOCUMENTS

| | | | | |
|---|---|---|---|---|
| CN | 107925215 A | | 4/2018 | |
| CN | 108352674 A | | 7/2018 | |
| CN | 207925886 U | | 9/2018 | |
| JP | S62-169484 A | | 7/1987 | |
| JP | H01-146381 A | | 6/1989 | |
| JP | H03-116885 A | | 5/1991 | |
| JP | 03167885 A | * | 7/1991 | H01S 3/0346 |
| JP | 2000-286482 A | | 10/2000 | |
| JP | 2002118308 A | * | 4/2002 | H01S 3/225 |
| JP | 2003-133622 A | | 5/2003 | |
| JP | 2003249702 A | * | 9/2003 | |
| JP | 2003-283007 A | | 10/2003 | |
| JP | 2005502209 A | * | 1/2005 | |
| JP | 2018-093211 A | | 6/2018 | |
| WO | 2015/068205 A1 | | 5/2015 | |
| WO | WO-2017072879 A1 | * | 5/2017 | H01S 3/02 |

OTHER PUBLICATIONS

International Search Report issued in PCT/JP2019/006241; mailed May 7, 2019.

Written Opinion issued in PCT/JP2019/006241; mailed May 7, 2019.

* cited by examiner

GAS LASER APPARATUS, LASER BEAM EMITTING METHOD OF GAS LASER APPARATUS, AND ELECTRONIC DEVICE MANUFACTURING METHOD

CROSS-REFERENCE TO RELATED APPLICATIONS

The present application is a continuation application of International Application No. PCT/JP2019/006241, filed on Feb. 20, 2019, the entire contents of which are hereby incorporated by reference.

BACKGROUND

1. Technical Field

The present disclosure relates to a gas laser apparatus, a laser beam emitting method of a gas laser apparatus, and an electronic device manufacturing method.

2. Related Art

Recently, improvement in resolution of semiconductor exposure apparatuses (hereinafter referred to as "exposure apparatuses") has been desired due to miniaturization and high integration of semiconductor integrated circuits. For this purpose, exposure light sources that output light with shorter wavelengths have been developed. As the exposure light source, a gas laser apparatus is generally used in place of a conventional mercury lamp. For example, as a gas laser apparatus for exposure, a KrF excimer laser apparatus that outputs an ultraviolet laser beam having a wavelength of 248 nm and an ArF excimer laser apparatus that outputs an ultraviolet laser beam having a wavelength of 193 nm are used.

As next generation exposure technology, immersion exposure is practically used in which a gap between an exposure lens of an exposure apparatus and a wafer is filled with a liquid. In the immersion exposure, a refractive index between the exposure lens and the wafer changes to shorten an apparent wavelength of light from an exposure light source. When the immersion exposure is performed using the ArF excimer laser apparatus as the exposure light source, the wafer is irradiated with ultraviolet light having a wavelength of 134 nm in water. This technology is referred to as ArF immersion exposure (or ArF immersion lithography).

The KrF excimer laser apparatus and the ArF excimer laser apparatus have a large natural oscillation range of about 350 to 400 pm. Thus, if a projection lens is made of a material that transmits ultraviolet light such as KrF and ArF laser beams, chromatic aberration may occur, thereby reducing resolution. Then, a spectral line width of a laser beam output from the gas laser apparatus needs to be narrowed to the extent that the chromatic aberration can be ignored. For this purpose, a line narrowing module (LNM) having a line narrowing element such as etalon or grating is sometimes provided in a laser resonator of the gas laser apparatus to narrow the spectrum line width. A laser apparatus in which the spectrum line width is narrowed is hereinafter referred to as a line narrowing laser apparatus.

LIST OF DOCUMENTS

Patent Documents

Patent Document 1: Japanese Unexamined Patent Application Publication No. 2000-286482
Patent Document 2: Japanese Unexamined Patent Application Publication No. 2003-133622
Patent Document 3: Japanese Unexamined Patent Application Publication No. 2003-283007

SUMMARY

One aspect of the present disclosure may be a gas laser apparatus including a chamber filled with a laser gas; a window provided in the chamber and allowing a laser beam to pass therethrough; an optical path tube connected to the chamber to surround a position of the window in the chamber; a gas supply port configured to supply a purge gas into the optical path tube; an exhaust port configured to exhaust a gas in the optical path tube; and a control unit, the exhaust port including a main exhaust port provided in the optical path tube such that the gas flows on a surface of the window, and an auxiliary exhaust port provided in the optical path tube upstream of a flow of the gas in the optical path tube with respect to the position of the window and a position of the main exhaust port, the control unit causing the gas to be exhausted through the main exhaust port before the laser beam is emitted from the chamber and causing the gas to be exhausted through the auxiliary exhaust port in at least a partial period when the laser beam is emitted from the chamber.

Another aspect of the present disclosure may be a gas laser apparatus including a master oscillator chamber filled with a laser gas and configured to emit oscillating light, and an amplifier chamber filled with a laser gas and configured to amplify the light emitted from the master oscillator chamber and emit amplified light; a master oscillator window provided in the master oscillator chamber and allowing a laser beam to pass therethrough, and an amplifier window provided in the amplifier chamber and allowing the laser beam to pass therethrough; a master oscillator optical path tube connected to the master oscillator chamber to surround a position of the master oscillator window in the master oscillator chamber, and an amplifier optical path tube connected to the amplifier chamber to surround a position of the amplifier window in the amplifier chamber; a master oscillator gas supply port configured to supply a purge gas into the master oscillator optical path tube, and an amplifier gas supply port configured to supply the purge gas into the amplifier optical path tube; a master oscillator exhaust port configured to exhaust a gas in the master oscillator optical path tube, and an amplifier exhaust port configured to exhaust a gas in the amplifier optical path tube; and a control unit, the master oscillator exhaust port including a master oscillator main exhaust port provided in the master oscillator optical path tube such that the gas in the master oscillator optical path tube flows on a surface of the master oscillator window, and a master oscillator auxiliary exhaust port provided in the master oscillator optical path tube upstream of a flow of the gas in the master oscillator optical path tube with respect to the position of the master oscillator window and a position of the master oscillator main exhaust port, the amplifier exhaust port including an amplifier main exhaust port provided in the amplifier optical path tube such that the gas in the amplifier optical path tube flows on a surface of the amplifier window, and an amplifier auxiliary exhaust port provided in the amplifier optical path tube upstream of a flow of the gas in the amplifier optical path tube with respect to the position of the amplifier window and a position of the amplifier main exhaust port, the control unit causing the gas to be exhausted through the master oscillator main exhaust port and the amplifier main exhaust port before the laser beam is emitted from the master oscillator chamber and causing the gas to be exhausted through the master oscillator auxiliary exhaust port and the amplifier auxiliary exhaust port in at least a partial period when the laser beam is emitted from the master oscillator chamber.

A further aspect of the present disclosure may be a laser beam emitting method of a gas laser apparatus, the gas laser apparatus including a chamber filled with a laser gas, a window provided in the chamber and allowing a laser beam to pass therethrough, an optical path tube connected to the chamber to surround a position of the window in the chamber, a gas supply port configured to supply a purge gas into the optical path tube, an exhaust port configured to exhaust a gas in the optical path tube, and a control unit, the exhaust port including a main exhaust port provided in the optical path tube such that the gas flows on a surface of the window, and an auxiliary exhaust port provided in the optical path tube upstream of a flow of the gas in the optical path tube with respect to the position of the window and a position of the main exhaust port, the control unit causing the gas to be exhausted through the main exhaust port before the laser beam is emitted from the chamber and causing the gas to be exhausted through the auxiliary exhaust port in at least a partial period when the laser beam is emitted from the chamber.

A further aspect of the present disclosure is an electronic device manufacturing method including causing a laser beam emitted from a gas laser apparatus to enter an exposure apparatus, the gas laser apparatus including a chamber filled with a laser gas, a window provided in the chamber and allowing the laser beam to pass therethrough, an optical path tube connected to the chamber to surround a position of the window in the chamber, a gas supply port configured to supply a purge gas into the optical path tube, an exhaust port configured to exhaust a gas in the optical path tube, and a control unit, the exhaust port including a main exhaust port provided in the optical path tube such that the gas flows on a surface of the window, and an auxiliary exhaust port provided in the optical path tube upstream of a flow of the gas in the optical path tube with respect to the position of the window and a position of the main exhaust port, the control unit causing the gas to be exhausted through the main exhaust port before the laser beam is emitted from the chamber and causing the gas to be exhausted through the auxiliary exhaust port in at least a partial period when the laser beam is emitted from the chamber; and exposing a photosensitive substrate to the laser beam within the exposure apparatus to manufacture an electronic device.

BRIEF DESCRIPTION OF THE DRAWINGS

With reference to the accompanying drawings, some embodiments of the present disclosure will be described below merely by way of example.

DESCRIPTION OF EMBODIMENTS

Figure 1:
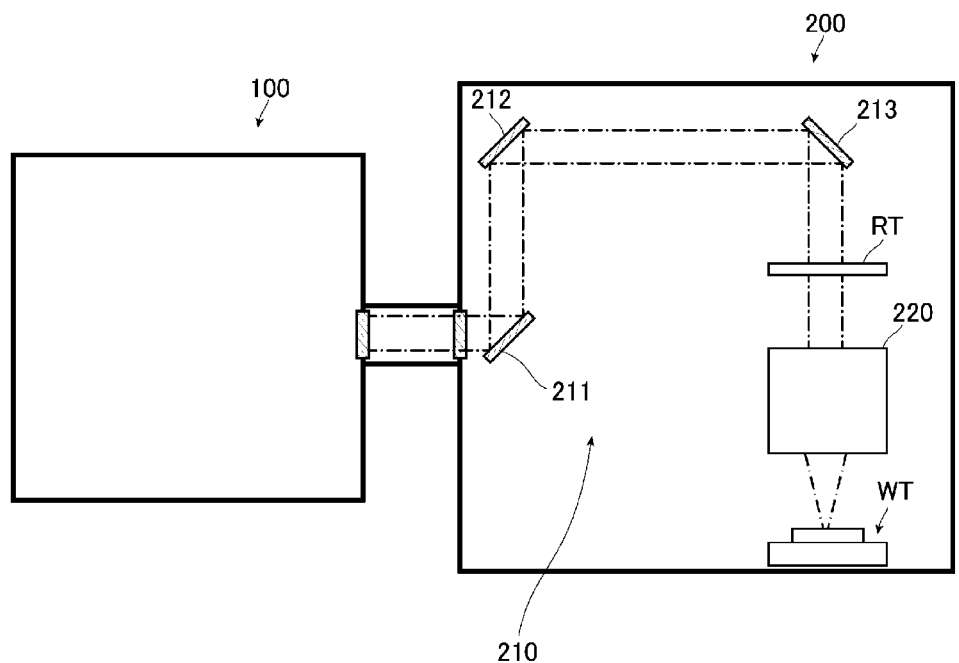
FIG. 1 is a schematic diagram of an exemplary configuration of the entire manufacturing device used in an exposure process in manufacture of an electronic device.

1. Description of manufacturing device used in exposure process in manufacture of electronic device
2. Description of gas laser apparatus of comparative example
    2.1 Configuration
    2.2 Operation
    2.3 Problem
3. Description of gas laser apparatus of Embodiment 1
    3.1 Configuration
    3.2 Operation
    3.3 Effect
4. Description of gas laser apparatus of Embodiment 2
    4.1 Configuration
    4.2 Operation
    4.3 Effect
5. Description of gas laser apparatus of Embodiment 3
    5.1 Configuration
    5.2 Operation
    5.3 Effect
6. Description of gas laser apparatus of Embodiment 4
    6.1 Configuration
    6.2 Operation
    6.3 Effect Now, with reference to the drawings, embodiments of the present disclosure will be described in detail.

The embodiments described below illustrate some examples of the present disclosure, and do not limit contents of the present disclosure. Also, all configurations and operations described in the embodiments are not necessarily essential as configurations and operations of the present disclosure. The same components are denoted by the same reference numerals, and overlapping descriptions are omitted.

1. Description of Manufacturing Device Used in Exposure Process in Manufacture of Electronic Device FIG. 1 is a schematic diagram of an exemplary configuration of the entire manufacturing device used in an exposure process in manufacture of an electronic device. As shown in FIG. 1, the manufacturing device used in the exposure process includes a gas laser apparatus 100 and an exposure apparatus 200. The exposure apparatus 200 includes an illumination optical system 210 including a plurality of mirrors 211, 212, 213, and a projection optical system 220. The illumination optical system 210 illuminates, with a laser beam incident from the gas laser apparatus 100, a reticle pattern on a reticle stage RT. The projection optical system 220 reduces and projects the laser beam having passed though the reticle and forms an image thereof on a workpiece (not shown) arranged on a workpiece table WT. The workpiece is a photosensitive substrate such as a semiconductor wafer coated with photoresist. The exposure apparatus 200 synchronously translates the reticle stage RT and the workpiece table WT to expose the workpiece to the laser beam reflecting the reticle pattern. Through the exposure process as described above, a device pattern is transferred onto the semiconductor wafer, thereby manufacturing a semiconductor device as an electronic device.

2. Description of Gas Laser Apparatus of Comparative Example

2.1 Configuration

Figure 2:
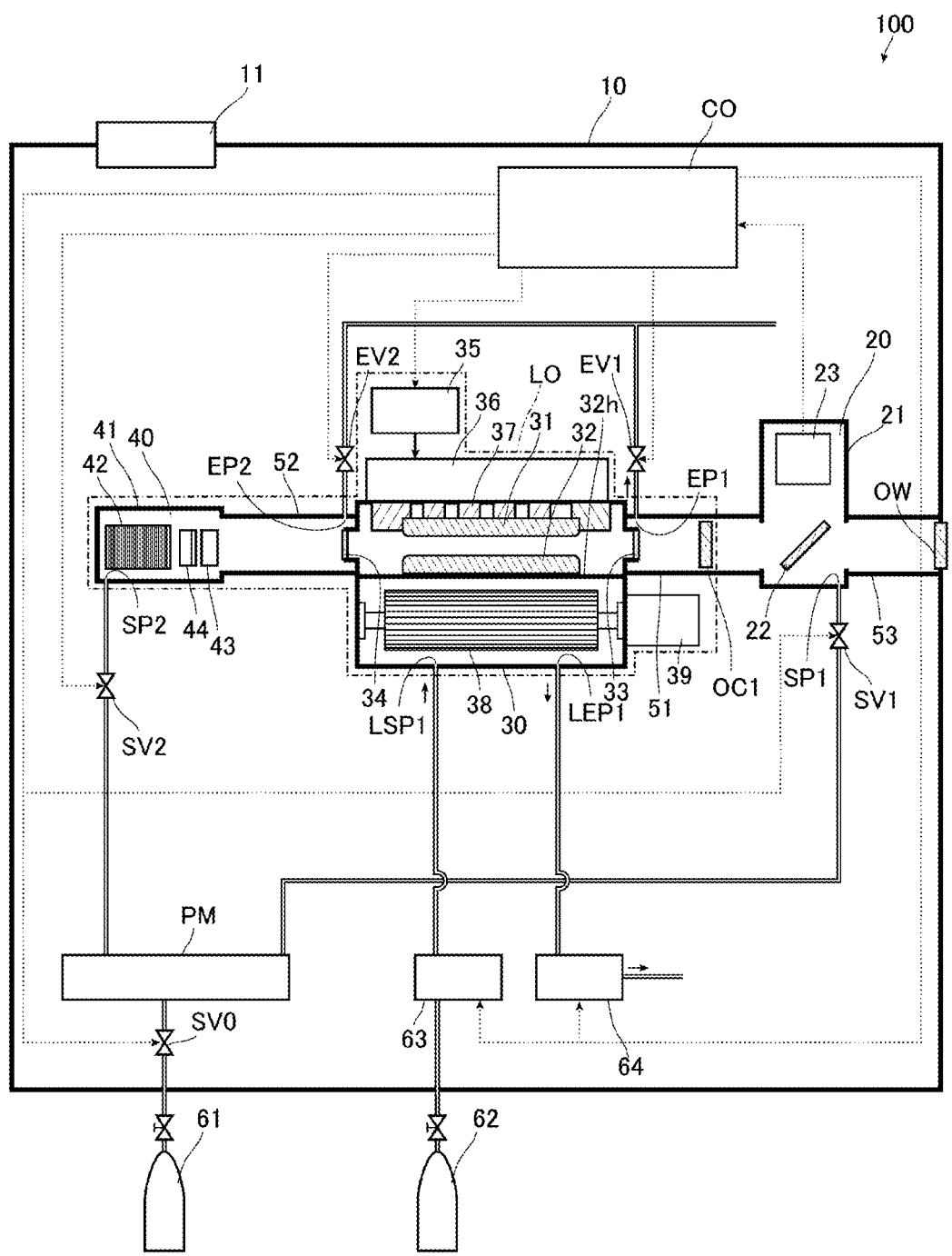
FIG. 2 is a schematic diagram of an exemplary configuration of the entire gas laser apparatus.

A gas laser apparatus of a comparative example will be described. FIG. 2 is a schematic diagram of an exemplary configuration of the entire gas laser apparatus of this example. As shown in FIG. 2, a gas laser apparatus 100 of this example mainly includes a casing 10, a laser oscillator LO, an energy monitor module 20, and a control unit CO. The gas laser apparatus 100 of this example is an ArF excimer laser apparatus using a mixed gas containing, for example, argon (Ar), fluorine ($F_2$), and neon (Ne). In this case, the gas laser apparatus 100 emits a pulse laser beam having a central wavelength of about 193 nm. The gas laser apparatus 100 may be a gas laser apparatus other than the ArF excimer laser apparatus, and for example, may be a KrF excimer laser apparatus using a mixed gas containing krypton (Kr), fluorine ($F_2$), and neon (Ne). In this case, the gas laser apparatus 100 emits a pulse laser beam having a central wavelength of about 248 nm. The mixed gas containing Ar, $F_2$, and Ne or the mixed gas containing Kr, $F_2$, and Ne as a laser medium is sometimes referred to as a laser gas.

The control unit CO can use, for example, an integrated circuit such as a microcontroller, an integrated circuit (IC), a large-scale integrated circuit (LSI), or an application specific integrated circuit (ASIC), or a numerical control (NC) device. When using the NC device, the control unit CO may or may not use a machine learning device. As described below, the control unit CO controls some components of the gas laser apparatus.

The laser oscillator LO mainly includes a chamber 30, a window including a first window 33 and a second window 34, a pair of electrodes 31, 32, a charger 35, a pulse power module 36, a cross flow fan 38, a motor 39, a line narrowing module 40, and an output coupling mirror OC1.

The chamber 30 is filled with a laser gas. The electrodes 31, 32 excite the laser medium by discharge, and are arranged to face each other in the chamber 30.

The chamber 30 has an opening, which is closed by an insulating portion 37 including an insulator. The electrode 31 is supported by the insulating portion 37. A feedthrough formed of a conductive member is embedded in the insulating portion 37. The feedthrough applies a voltage supplied from the pulse power module 36 to the electrode 31. The electrode 32 is supported by an electrode holder 32h. The electrode holder 32h is secured to an inner surface of the chamber 30, and electrically connected to the chamber 30.

The charger 35 is a DC power supply device that charges a capacitor (not shown) provided in the pulse power module 36 with a predetermined voltage. The pulse power module 36 includes a switch controlled by the control unit CO. When the switch is turned on, the pulse power module 36 increases the voltage applied from the charger 35 to generate a pulsed high voltage, and applies the high voltage between the electrodes 31, 32.

The cross flow fan 38 is arranged in the chamber 30. A space in which the cross flow fan 38 is arranged communicates with a space between the electrodes 31, 32 in the chamber 30. Thus, the cross flow fan 38 rotates to circulate the laser gas filling the chamber 30 in a predetermined direction. The motor 39 arranged outside the chamber 30 is connected to the cross flow fan 38. The motor 39 rotates to rotate the cross flow fan 38. The motor 39 is turned on/off or adjusted in rotation speed by control with the control unit CO. Thus, the control unit CO can control the motor 39 to adjust a circulation speed of the laser gas circulating in the chamber 30.

The first window 33 and the second window 34 are provided to face each other with a space therebetween, the space being between the electrode 31 and the electrode 32 in the chamber 30. The first window 33 is provided at one end of the chamber 30 in a traveling direction of the laser beam, and the second window 34 is provided at the other end of the chamber 30 in the traveling direction of the laser beam. As described later, in the gas laser apparatus 100, light oscillates in an optical path including the chamber 30 to emit the laser beam, and thus the laser beam generated in the chamber 30 is emitted through the first window 33 and the second window 34 to the outside of the chamber 30. The first window 33 and the second window 34 are made of, for example, calcium fluoride. The first window 33 and the second window 34 may be coated with a fluoride or oxide film.

A first optical path tube 51 is connected to the one end of the chamber 30 at which the first window 33 is provided. A position of the first window 33 in the chamber 30 protrudes into the first optical path tube 51 with a gap from an inner wall of the first optical path tube 51. Thus, the first window 33 is located in the first optical path tube 51.

The output coupling mirror OC1 is provided on the one end side of the chamber 30, and arranged in the first optical path tube 51. The output coupling mirror OC1 is an optical element that the laser beam emitted through the first window 33 enters. The output coupling mirror OC1 transmits one part of the laser beam emitted through the first window 33, and reflects and returns the other part through the first window 33 into the chamber 30. The output coupling mirror OC1 is formed of, for example, an element including a calcium fluoride substrate coated with a dielectric multilayer film.

A second optical path tube 52 is connected to the other end of the chamber 30 at which the second window 34 is provided. In other words, the optical path tube connected to the chamber 30 includes the first optical path tube 51 and the second optical path tube 52. A position of the second window 34 in the chamber 30 protrudes into the second optical path tube 52 with a gap from an inner wall of the second optical path tube 52. Thus, the second window 34 is located in the second optical path tube 52.

The line narrowing module 40 is connected to the second optical path tube 52. Thus, the line narrowing module 40 is provided on the other end side of the chamber 30. The line narrowing module 40 includes a casing 41, a grating 42, and prisms 43, 44. The casing 41 has an opening, through which a space in the casing 41 communicates with a space in the second optical path tube 52. The casing 41, the second optical path tube 52, and the chamber 30 form a closed space.

The grating 42 and the prisms 43, 44 are arranged in the casing 41. The grating 42 and the prisms 43, 44 are optical elements that the laser beam emitted through the second window 34 enters. The grating 42 is configured in a Littrow arrangement such that a wavelength dispersion surface substantially matches a plane perpendicular to a propagating direction of the laser beam and that an incident angle of the laser beam substantially matches a diffraction angle thereof. In this example, the grating 42 may be an echelle grating blazed for a wavelength of about 193 nm.

At least one of the prisms 43, 44 is secured on a rotary stage, and the one of the prisms 43, 44 secured on the rotary stage slightly rotates to adjust an incident angle of light on the grating 42. The incident angle of the light on the grating 42 is adjusted to adjust a wavelength of the light reflected by the grating 42. Thus, the light emitted through the second window 34 in the chamber 30 is reflected by the grating 42 through the prisms 43, 44 to adjust the wavelength of the light returning to the chamber 30 to a desired wavelength. In this example, the two prisms are arranged in the line narrowing module 40, but one or three or more prisms may be arranged.

The output coupling mirror OC1 and the grating 42 with the chamber 30 therebetween constitute an optical resonator, and the chamber 30 is arranged in an optical path of the optical resonator. Thus, the light emitted from the chamber 30 reciprocates between the grating 42 in the line narrowing module 40 and the output coupling mirror OC1 and is amplified every time it passes through a laser gain space between the electrodes 31, 32. Part of the amplified light passes through the output coupling mirror OC1 and is emitted as a pulse laser beam.

The energy monitor module 20 is arranged in an optical path of the pulse laser beam emitted from the output coupling mirror OC1 in the laser oscillator LO. The energy monitor module 20 includes a casing 21, a beam splitter 22, and a pulse energy sensor 23. The casing 21 is connected to the first optical path tube 51. The beam splitter 22 and the pulse energy sensor 23 are optical elements that the laser beam emitted through the first window 33 enters. The casing 21 has an opening, through which a space in the casing 21 communicates with a space in the first optical path tube 51. The beam splitter 22 and the pulse energy sensor 23 are arranged in the casing 21.

The beam splitter 22 transmits the pulse laser beam emitted from the laser oscillator LO with high transmittance, and reflects part of the pulse laser beam toward a light receiving surface of the pulse energy sensor 23. The pulse energy sensor 23 detects pulse energy of the pulse laser beam having entered the light receiving surface, and outputs data of the detected pulse energy to the control unit CO.

An opening is formed on a side of the casing 21 of the energy monitor module 20 opposite to the side to which the first optical path tube 51 is connected, and an optical path tube 53 is connected to surround the opening. Thus, the space in the first optical path tube 51, the space in the casing 21, and a space in the optical path tube 53 communicate with each other. The optical path tube 53 is connected to the casing 10. A laser beam exit window OW is provided in a position of the casing 10 surrounded by the optical path tube 53. Thus, the beam passing through the beam splitter 22 in the energy monitor module 20 is emitted through the optical path tube 53 and through the laser beam exit window OW to the outside of the casing 10.

A purge gas supply source 61 storing a purge gas is arranged outside the casing 10. The purge gas contains an inert gas such as high purity nitrogen containing few impurities such as oxygen. A pipe is connected to the purge gas supply source 61 and extends into the casing 10. A main gas supply valve SV0 is provided in the middle of the pipe. Opening of the main gas supply valve SV0 is adjusted according to a control signal from the control unit CO. The pipe having the main gas supply valve SV0 is connected to a purge gas manifold PM.

A plurality of pipes are connected to the purge gas manifold PM, and a first gas supply valve SV1 is provided in the middle of one of the pipes. Opening of the first gas supply valve SV1 is adjusted according to a control signal form the control unit CO. The pipe having the first gas supply valve SV1 is connected to the casing 21 of the energy monitor module 20. The connecting portion is a first gas supply port SP1 that supplies the purge gas into the casing 21. Thus, the first gas supply port SP1 supplies the purge gas through the casing 21 into the first optical path tube 51 and the optical path tube 53.

A second gas supply valve SV2 is provided in the middle of another pipe connected to the purge gas manifold PM. Opening of the second gas supply valve SV2 is adjusted according to a control signal from the control unit CO. The pipe having the second gas supply valve SV2 is connected to the casing 41 of the line narrowing module 40. The connecting portion is a second gas supply port SP2 that supplies the purge gas into the casing 41. Thus, the second gas supply port SP2 supplies the purge gas through the casing 41 into the second optical path tube 52.

In other words, the gas supply port of the gas laser apparatus 100 of this embodiment includes the first gas supply port SP1 and the second gas supply port SP2.

A pipe having a first exhaust valve EV1 is connected to the first optical path tube 51. Opening of the first exhaust valve EV1 is adjusted according to a control signal from the control unit CO. The first exhaust valve EV1 opens to exhaust the gas in the first optical path tube 51. The connecting portion of the pipe having the first exhaust valve EV1 to the first optical path tube 51 is a first exhaust port EP1 that exhausts the gas in the first optical path tube 51. In this example, the first exhaust port EP1 is provided beside the first window 33 in the first optical path tube 51. Specifically, the first exhaust port EP1 is provided in a position including a plane extending along the first window 33 and perpendicular to the traveling direction of the laser beam in the first optical path tube 51. The first exhaust port EP1 may be provided closer to the chamber 30 than this plane in the first optical path tube 51. Specifically, the first exhaust port EP1 may be provided near the first window 33 in the first optical path tube 51. The purge gas supplied through the first gas supply port SP1 is mixed with the gas in the casing 21, the first optical path tube 51, and the optical path tube 53, and flows to the first exhaust port EP1. Thus, the purge gas can reduce an oxygen concentration in the casing 21, the first optical path tube 51, and the optical path tube 53, and the reduced oxygen concentration can be maintained. This can also suppress adhesion, to surfaces of the beam splitter 22, the output coupling mirror OC1, and the first window 33 located in a gas flow path, of impurities due to outgassing from components or the like. In other words, the first exhaust port EP1 is provided in the first optical path tube 51 such that the gas flows on the surfaces of the beam splitter 22, the output coupling mirror OC1, and the first window 33.

A pipe having a second exhaust valve EV2 is connected to the second optical path tube 52. Opening of the second exhaust valve EV2 is adjusted according to a control signal from the control unit CO. The second exhaust valve EV2 opens to exhaust the gas in the second optical path tube 52.

The connecting portion of the pipe having the second exhaust valve EV2 to the second optical path tube 52 is a second exhaust port EP2 that exhausts the gas in the second optical path tube 52. In this example, the second exhaust port EP2 is provided beside the second window 34 in the second optical path tube 52. Specifically, the second exhaust port EP2 is provided in a position including a plane extending along the second window 34 and perpendicular to the traveling direction of the laser beam in the second optical path tube 52. The second exhaust port EP2 may be provided closer to the chamber 30 than this plane in the second optical path tube 52. Specifically, the second exhaust port EP2 may be provided near the second window 34 in the second optical path tube 52. The purge gas supplied through the second gas supply port SP2 is mixed with the gas in the casing 41 and the second optical path tube 52, and flows to the second exhaust port EP2. Thus, the purge gas can reduce an oxygen concentration in the casing 41 and the second optical path tube 52, and the reduced oxygen concentration can be maintained. This can also suppress adhesion, to surfaces of the grating 42, the prisms 43, 44, and the second window 34 located in the gas flow path, of impurities due to outgassing from components or the like. In other words, the second exhaust port EP2 is provided in the second optical path tube 52 such that the gas flows on the surfaces of the grating 42, the prisms 43, 44, and the second window 34.

As such, the exhaust port provided in the optical path tube in the gas laser apparatus 100 of this example includes the first exhaust port EP1 and the second exhaust port EP2.

In this example, the pipe having the first exhaust valve EV1 and the pipe having the second exhaust valve EV2 are connected to a different pipe, through which the gas in the first optical path tube 51 and the gas in the second optical path tube 52 are exhausted into the casing 10.

A laser gas supply source 62 storing a laser gas is further arranged outside the casing 10. The laser gas supply source 62 supplies a plurality of gases used as the laser gas. In this example, the laser gas supply source 62 supplies, for example, a mixed gas containing $F_2$, Ar, and Ne. In the case of a KrF excimer laser, the laser gas supply source 62 supplies, for example, a mixed gas containing $F_2$, Kr, and Ne. A pipe is connected to the laser gas supply source 62 and extends into the casing 10. The pipe is connected to a laser gas supply device 63. The laser gas supply device 63 has a valve or a flow regulating valve (not shown), and a different pipe connected to the chamber 30 is connected to the laser gas supply device 63. The laser gas supply device 63 uses the gases as the laser gas according to a control signal from the control unit CO, and supplies the laser gas through the different pipe into the chamber 30. The connecting portion of the different pipe to the chamber 30 is a laser gas supply port LSP1 that supplies the laser gas into the chamber 30.

An exhaust device 64 is arranged in the casing 10. The exhaust device 64 is connected to the chamber 30 by a pipe. The exhaust device 64 exhausts the gas in the chamber 30 through the pipe into the casing 10. In this case, the exhaust device 64 adjusts an exhaust amount or the like according to a control signal from the control unit CO, and removes an $F_2$ gas from the gas exhausted from the chamber 30 using a halogen filter (not shown). The connecting portion of the pipe to the chamber 30 is a laser gas exhaust port LEP1 that exhausts the gas from the chamber 30.

The casing 10 has an exhaust duct 11. The gas in the casing 10 is exhausted through the exhaust duct 11 to the outside of the casing 10. Thus, the gas in the chamber 30 exhausted from the exhaust device 64 into the casing 10, and the gas in the first optical path tube 51 and the second optical path tube 52 exhausted through the first exhaust port EP1 and the second exhaust port EP2 into the casing 10 are exhausted through the exhaust duct 11 to the outside of the casing 10.

2.2 Operation

Figure 3:
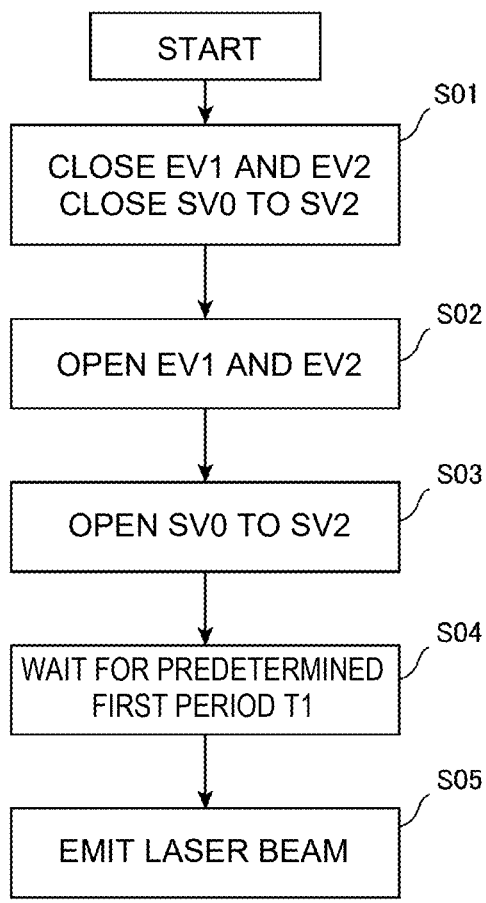
FIG. 3 is a flowchart of an operation of a control unit until a gas laser apparatus of a comparative example emits a laser beam.

Next, an operation of the gas laser apparatus 100 of the comparative example will be described. FIG. 3 is a flowchart of an operation of the control unit CO until the gas laser apparatus 100 of the comparative example emits the laser beam. As shown in FIG. 3, in this example, the operation of the control unit CO until the laser beam is emitted includes step S01 to step S05.

(Step S01)

In introduction or maintenance of the gas laser apparatus 100, for example, air flows into the first optical path tube 51 and the second optical path tube 52. This is a state of start in FIG. 3.

In this step, the control unit CO closes the first exhaust valve EV1 and the second exhaust valve EV2. Further, the control unit CO closes the main gas supply valve SV0, the first gas supply valve SV1, and the second gas supply valve SV2. Thus, no purge gas is supplied into the first optical path tube 51 and the second optical path tube 52, and no gas is exhausted through the first optical path tube 51 and the second optical path tube 52. There may be a case that at the time of start, any of the first exhaust valve EV1, the second exhaust valve EV2, the main gas supply valve SV0, the first gas supply valve SV1, and the second gas supply valve SV2 is open. In such a case, the control unit CO closes the open valve in this step. When all the valves are closed at the time of start, the control unit CO keeps the valves closed.

(Step S02)

In this step, the control unit CO opens the first exhaust valve EV1 and the second exhaust valve EV2. At this time, no purge gas is supplied, and thus the gas in the first optical path tube 51, the casing 21, and the optical path tube 53, and the gas in the second optical path tube 52 and the casing 41 are not exhausted.

(Step S03)

In this step, the control unit CO opens the main gas supply valve SV0, the first gas supply valve SV1, and the second gas supply valve SV2. Thus, the purge gas is supplied through the first gas supply port SP1 into the casing 21, and the purge gas is supplied through the second gas supply port SP2 into the casing 41. Since the first exhaust valve EV1 and the second exhaust valve EV2 are opened in step S02, the gas in the first optical path tube 51, the casing 21, and the optical path tube 53 is pushed out by the purge gas and exhausted through the first exhaust port EP1 into the casing 10. Thus, the purge gas reduces the oxygen concentration in the casing 21, the first optical path tube 51, and the optical path tube 53, and the reduced oxygen concentration is maintained. Also, the gas flows on the surfaces of the beam splitter 22, the output coupling mirror OC1, and the first window 33, thereby suppressing adhesion of oxygen to the surfaces and the like. The gas in the second optical path tube 52 and the casing 41 is pushed out by the purge gas and exhausted through the second exhaust port EP2 into the casing 10. Thus, the purge gas reduces the oxygen concentration in the casing 41 and the second optical path tube 52, and the reduced oxygen concentration is maintained. The gas flows on the surfaces of the grating 42, the prisms 43, 44, and the second window 34, thereby suppressing adhesion of oxygen to the surfaces and the like. The gas exhausted into the casing 10 is exhausted through the exhaust duct 11 to the outside of the casing 10.
(Step S04)

In this step, the control unit CO maintains the state in step S03 for a predetermined first period T1. The first period T1 is, for example, 5 to 10 minutes. In this step, the oxygen concentration in the first optical path tube 51, the casing 21, and the optical path tube 53 reaches a predetermined concentration or lower, and the oxygen concentration in the second optical path tube 52 and the casing 41 reaches a predetermined concentration or lower.

Before completion of step S04, the control unit CO causes the laser gas to be supplied into the chamber 30 and causes the supplied laser gas to be circulated. Specifically, the control unit CO controls the exhaust device 64 to exhaust the gas in the chamber 30 through the laser gas exhaust port LEP1 into the casing 10. Then, a predetermined amount of laser gas is supplied through the laser gas supply port LSP1. As a result, the laser gas fills the chamber 30. The control unit CO also controls the motor 39 to rotate the cross flow fan 38. The cross flow fan 38 rotates to circulate the laser gas.
(Step S05)

In this step, the control unit CO causes the laser beam to be emitted. Specifically, in this step, the control unit CO controls the motor 39 to maintain circulation of the laser gas in the chamber 30. The control unit CO also controls the charger 35 and the switch in the pulse power module 36 to apply a high voltage between the electrodes 31, 32. When the high voltage is applied between the electrodes 31, 32, insulation between the electrodes 31, 32 is broken to cause discharge. By energy of the discharge, the laser medium contained in the laser gas between the electrodes 31, 32 is excited to cause spontaneous emission when returning to the ground state. Part of the light is emitted through the second window 34, and reflected by the grating 42 through the prisms 43, 44. The light reflected by the grating 42 and again propagating through the second window 34 into the chamber 30 is line narrowed. With the line narrowed light, the excited laser medium causes stimulated emission to amplify the light. Then, the light having a predetermined wavelength resonates between the grating 42 and the output coupling mirror OC1 to cause laser oscillation. Then, part of the laser beam passes through the output coupling mirror OC1 and is emitted through the laser beam exit window OW.

At this time, the laser beam reflected by the beam splitter 22 is received by the pulse energy sensor 23, and the pulse energy sensor 23 outputs, to the control unit CO, a signal according to intensity of energy of the received laser beam. The control unit CO controls the charger 35 and the pulse power module 36 based on the signal, and adjusts power of the emitted laser beam.

The state in step S04 is maintained during this step. Thus, the gas flowing through the first optical path tube 51, the casing 21, and the optical path tube 53 maintains the oxygen concentration in the first optical path tube 51, the casing 21, and the optical path tube 53 at the predetermined concentration or lower. The gas flowing through the second optical path tube 52 and the casing 41 maintains the oxygen concentration in the second optical path tube 52 and the casing 41 at the predetermined concentration or lower.

Part of step S01 may be omitted. Specifically, when either the first exhaust valve EV1 or the second exhaust valve EV2 is open at the time of start, the control unit CO may directly go to step S02. Step S02 and step S03 may be simultaneously performed.

2.3 Problem

As described above, when the laser beam oscillates or stops, the purge gas is supplied and thus the gas in the first optical path tube 51 and the gas in the second optical path tube 52 flow on the surfaces of the first window 33 and the second window 34. Temperatures of the gases are substantially the same as that of the purge gas. A temperature in the chamber 30 becomes higher than that of the purge gas due to frictional heat or the like caused by circulation of the laser gas. Thus, the surfaces of the first window 33 and the second window 34 opposite to the chamber 30 are cooled by the gases flowing on the surfaces, and become low in temperature than the surfaces of the first window 33 and the second window 34 on the side of the chamber 30. Then, when the laser beam is emitted, the first window 33 and the second window 34 are heated by energy of the laser beam. Thus, there is a concern that at start and stop of laser oscillation, a temperature difference rapidly occurs between the surfaces of the first window 33 and the second window 34 on the side of the chamber 30 and the surfaces on the opposite side, and the first window 33 and the second window 34 are damaged by a thermal shock, thereby reducing durability of the gas laser apparatus 100.

Thus, embodiments below exemplify a gas laser apparatus with high durability.

3. Description of Gas Laser Apparatus of Embodiment 1

Next, a configuration of a gas laser apparatus of Embodiment 1 will be described. The same components as those described above are denoted by the same reference numerals, and overlapping descriptions are omitted unless otherwise stated.

3.1 Configuration

Figure 4:
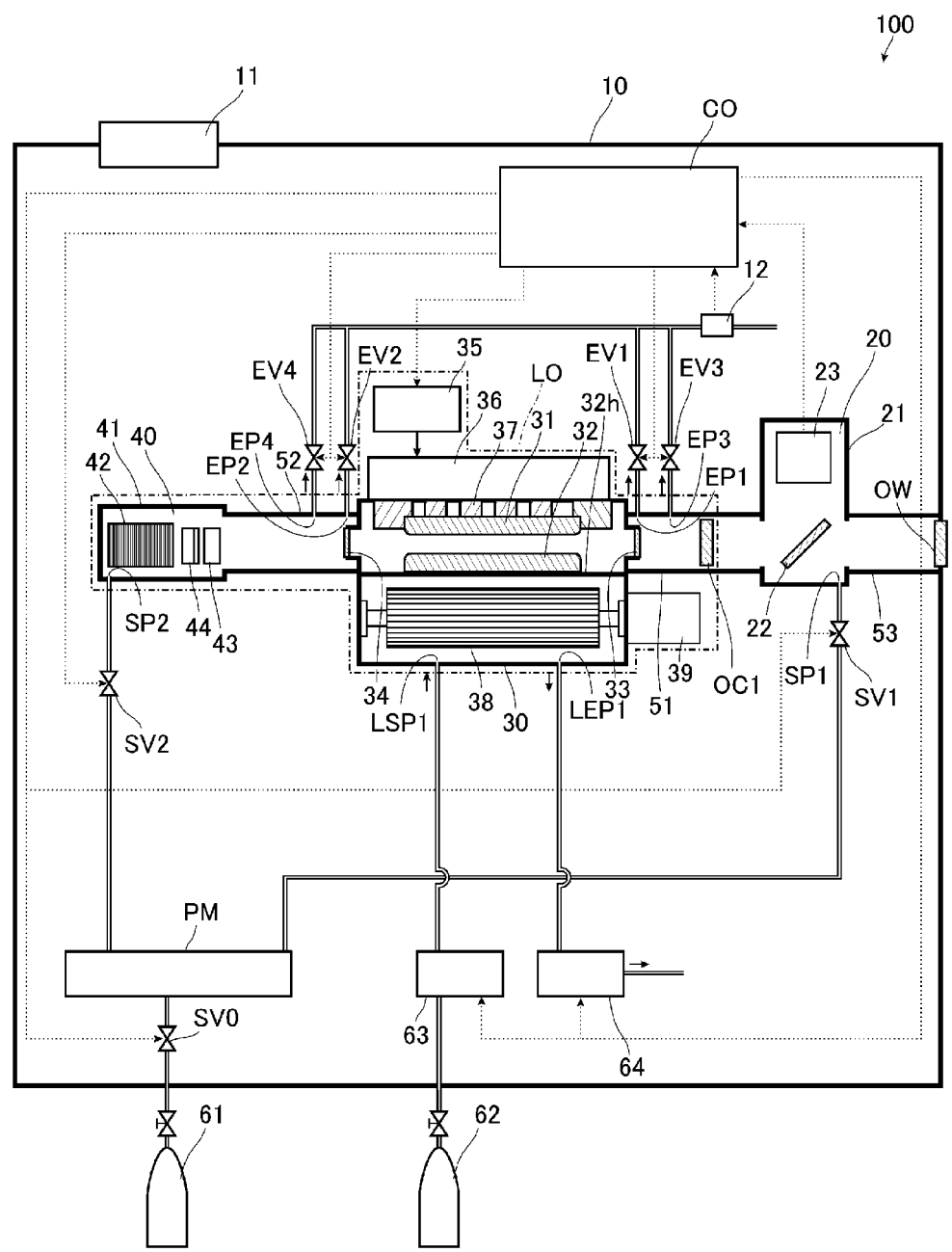
FIG. 4 is a schematic diagram of an exemplary configuration of the entire gas laser apparatus of Embodiment 1.

FIG. 4 is a schematic diagram of an exemplary configuration of the entire gas laser apparatus of this embodiment. As shown in FIG. 4, a gas laser apparatus 100 of this embodiment is mainly different from the gas laser apparatus 100 of the comparative example in including an oxygen concentration meter 12, a first auxiliary exhaust valve EV3 and a second auxiliary exhaust valve EV4, and a first auxiliary exhaust port EP3 and a second auxiliary exhaust port EP4. In the embodiments below, the first exhaust valve EV1 described in the comparative example is referred to as a first main exhaust valve EV1, the second exhaust valve EV2 is referred to as a second main exhaust valve EV2, the first exhaust port EP1 is referred to as a first main exhaust port EP1, and the second exhaust port EP2 is referred to as a second main exhaust port EP2.

The first auxiliary exhaust valve EV3 is provided in a pipe connected to a first optical path tube 51, and opening of the first auxiliary exhaust valve EV3 is adjusted according to a control signal from a control unit CO. The connecting portion of the pipe having the first auxiliary exhaust valve EV3 to the first optical path tube 51 is the first auxiliary exhaust port EP3 that exhausts a gas in the first optical path tube 51. In other words, the first exhaust port provided in the first optical path tube 51 in this embodiment includes the first main exhaust port EP1 as a main exhaust port and the first auxiliary exhaust port EP3 as an auxiliary exhaust port. The first auxiliary exhaust valve EV3 opens to exhaust the gas in the first optical path tube 51 through the first auxiliary exhaust port EP3. In this embodiment, the first auxiliary exhaust port EP3 is provided upstream of a flow of the gas in the first optical path tube 51 with respect to a position of a first window 33 and a position of the first main exhaust port EP1. Thus, when the first main exhaust port EP1 is provided in a position including a plane extending along the first window 33 and perpendicular to a traveling direction of a laser beam in the first optical path tube 51, the first auxiliary exhaust port EP3 is provided upstream of the flow of the gas in the first optical path tube 51 with respect to the first main exhaust port EP1. Alternatively, when the first main exhaust port EP1 is provided closer to the chamber 30 than this plane, the first auxiliary exhaust port EP3 is provided upstream of the flow of the gas in the first optical path tube 51 with respect to the position of the first window 33. The pipe having the first auxiliary exhaust valve EV3 is connected to a different pipe to which a pipe having the first main exhaust valve EV1 and a pipe having the second main exhaust valve EV2 are connected. Thus, the gas in the first optical path tube 51 exhausted through the first auxiliary exhaust port EP3 is exhausted through the different pipe into a casing 10.

The second auxiliary exhaust valve EV4 is provided in a pipe connected to a second optical path tube 52, and opening of the second auxiliary exhaust valve EV4 is adjusted according to a control signal from the control unit CO. The connecting portion of the pipe having the second auxiliary exhaust valve EV4 to the second optical path tube 52 is the second auxiliary exhaust port EP4 that exhausts a gas in the second optical path tube 52. In other words, the second exhaust port provided in the second optical path tube 52 in this embodiment includes the second main exhaust port EP2 as a main exhaust port and the second auxiliary exhaust port EP4 as an auxiliary exhaust port. The second auxiliary exhaust valve EV4 opens to exhaust the gas in the second optical path tube 52 through the second auxiliary exhaust port EP4. In this embodiment, the second auxiliary exhaust port EP4 is provided upstream of a flow of the gas in the second optical path tube 52 with respect to a position of a second window 34 and a position of the second main exhaust port EP2. Thus, when the second main exhaust port EP2 is provided in a position including a plane extending along the second window 34 and perpendicular to the traveling direction of the laser beam in the second optical path tube 52, the second auxiliary exhaust port EP4 is provided upstream of the flow of the gas in the second optical path tube 52 with respect to the second main exhaust port EP2. Alternatively, when the second main exhaust port EP2 is provided closer to the chamber 30 than this plane, the second auxiliary exhaust port EP4 is provided upstream of the flow of the gas in the second optical path tube 52 with respect to the position of the second window 34. The pipe having the second auxiliary exhaust valve EV4 is connected to the different pipe to which the pipe having the first main exhaust valve EV1 and the pipe having the second main exhaust valve EV2 are connected. Thus, the gas in the second optical path tube 52 exhausted through the second auxiliary exhaust port EP4 is exhausted through the different pipe into the casing 10.

The oxygen concentration meter 12 is provided near an outlet of the different pipe to which the pipe having the first main exhaust valve EV1 and the pipe having the second main exhaust valve EV2 are connected. The oxygen concentration meter 12 measures a concentration of oxygen contained in the gas in the first optical path tube 51 exhausted through the first main exhaust port EP1, and a concentration of oxygen contained in the gas in the second optical path tube 52 exhausted through the second main exhaust port EP2. Examples of the oxygen concentration meter 12 can include, for example, zirconia type, magnetic, laser spectroscopic, electrode type oxygen concentration meters. For example, a zirconia type concentration cell oxygen concentration meter is preferable in terms of high reflectivity, and a variable wavelength semiconductor laser spectroscopic oxygen concentration meter is preferable because it can measure an oxygen concentration without hardly receiving an influence of interference of gases other than oxygen. The pipe having the first auxiliary exhaust valve EV3 and the pipe having the second auxiliary exhaust valve EV4 are also connected to the different pipe. Thus, the oxygen concentration meter 12 can also measure a concentration of oxygen contained in the gas in the first optical path tube 51 exhausted through the first auxiliary exhaust port EP3, and a concentration of oxygen contained in the gas in the second optical path tube 52 exhausted through the second auxiliary exhaust port EP4.

3.2 Operation

First Example

Figure 5:
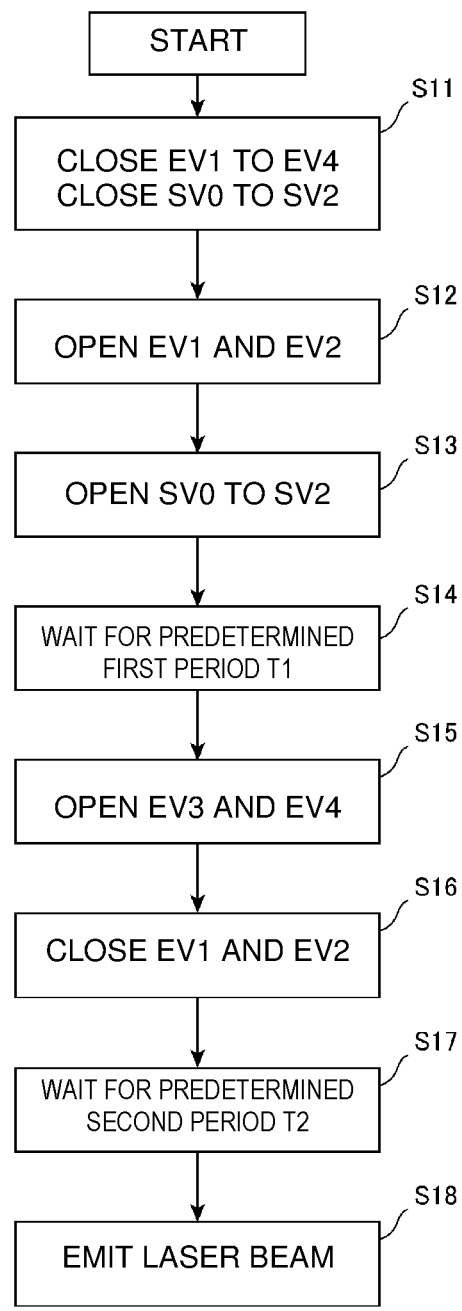
FIG. 5 is a flowchart of a first example of an operation of a control unit before the gas laser apparatus of Embodiment 1 emits a laser beam.

First, a first example of an operation of the gas laser apparatus 100 of this embodiment will be described. FIG. 5 is a flowchart of a first example of an operation of the control unit CO until the gas laser apparatus 100 of this embodiment emits a laser beam. As shown in FIG. 5, in this example, the operation of the control unit CO until the laser beam is emitted includes step S11 to step S18.

(Step S11)

The state of start in this embodiment is the same as that in the comparative example described with reference to FIG. 3.

In this step, as in step S01 of the comparative example, the control unit CO closes the first main exhaust valve EV1, the second main exhaust valve EV2, a main gas supply valve SV0, a first gas supply valve SV1, and a second gas supply valve SV2. Further, in this embodiment, the control unit CO closes the first auxiliary exhaust valve EV3 and the second auxiliary exhaust valve EV4. Thus, in this step, as in step S01 of the comparative example, no purge gas is supplied into the first optical path tube 51 and the second optical path tube 52, and the no gas is exhausted through the first optical path tube 51 and the second optical path tube 52. There may be a case that at the time of start, any of the first main exhaust valve EV1, the second main exhaust valve EV2, the first auxiliary exhaust valve EV3, the second auxiliary exhaust valve EV4, the main gas supply valve SV0, the first gas supply valve SV1, and the second gas supply valve SV2 is open. In such a case, the control unit CO closes the open valve in this step. When all the valves are closed at the time of start, the control unit CO keeps the valves closed.

(Steps S12, S13, S14)

In steps S12, S13, S14 in this embodiment, the control unit CO performs the same operation as in steps S02, S03, S04 in the comparative example. Thus, in step S13, the control unit CO exhausts the gases through the first main exhaust port EP1 and the second main exhaust port EP2 as the main exhaust ports before the laser beam is emitted from the chamber 30. Thus, at the time of end of step S14, the oxygen concentration in the first optical path tube 51, the casing 21, and the optical path tube 53 reaches a predetermined concentration or lower, and the oxygen concentration in the second optical path tube 52 and the casing 41 reaches a predetermined concentration or lower.

(Step S15)

In this step, the control unit CO opens the first auxiliary exhaust valve EV3 and the second auxiliary exhaust valve EV4. In step S12, the first main exhaust valve EV1 and the second main exhaust valve EV2 are opened. Thus, the gas in the first optical path tube 51 is exhausted through the first main exhaust port EP1 and the first auxiliary exhaust port EP3 into the casing 10, and the gas in the second optical path tube 52 is exhausted through the second main exhaust port EP2 and the second auxiliary exhaust port EP4 into the casing 10. In other words, in this step, the gases are exhausted through the first auxiliary exhaust port EP3 and the second auxiliary exhaust port EP4 as the auxiliary exhaust ports. Thus, amounts of the gases exhausted through the first main exhaust port EP1 and the second main exhaust port EP2 decrease as compared to the state before this step. Thus, the flows of the gases in the first optical path tube 51 and the second optical path tube 52 change to reduce amounts of the gases flowing on the surfaces of the first window 33 and the second window 34.

(Step S16)

In this step, the control unit CO closes the first main exhaust valve EV1 and the second main exhaust valve EV2. Thus, no gas is exhausted through the first main exhaust port EP1 and the second main exhaust port EP2, and amounts of the gases exhausted through the first auxiliary exhaust port EP3 and the second auxiliary exhaust port EP4 increase. Thus, the flows of the gases in the first optical path tube 51 and the second optical path tube 52 further change to further reduce the amounts of the gases flowing on the surfaces of the first window 33 and the second window 34.

In this embodiment, before completion of step S17, the control unit CO causes the laser gas to be supplied into the chamber 30 and causes the supplied laser gas to be circulated. In this embodiment, a procedure of the laser gas being supplied into the chamber 30 and circulated is the same as that in the comparative example.

(Step S17)

In this step, the control unit CO maintains the state in step S16 for a predetermined second period T2 after the first auxiliary exhaust valve EV3 and the second auxiliary exhaust valve EV4 are opened in step S15. The second period T2 is, for example, 5 to 10 minutes. Thus, step S16 is performed within the second period T2 after step S15. For example, step S15 and step S16 may be simultaneously performed. In this step, the amounts of the gases flowing on the surfaces of the first window 33 and the second window 34 decrease as described above. Thus, at the time of end of this step, cooling of the first window 33 on the side of the first optical path tube 51 with the gas in the first optical path tube 51 is suppressed, and cooling of the second window 34 on the side of the second optical path tube 52 with the gas in the second optical path tube 52 is suppressed. Thus, at the time of completion of this step, a difference between a temperature of the first window 33 on the side of the chamber 30 and a temperature thereof on the side of the first optical path tube 51, and a difference between a temperature of the second window 34 on the side of the chamber 30 and a temperature thereof on the side of the second optical path tube 52 become smaller than those in the comparative example.

(Step S18)

In this step, the control unit CO causes the laser beam to be emitted as in step S05 in the comparative example.

In step S18, the control unit CO may reduce opening of the main gas supply valve SV0 to reduce an amount of the purge gas to be supplied into the casings 21, 41. In this case, when the laser beam is emitted, the amounts of the gases flowing on the surfaces of the first window 33 and the second window 34 can be further reduced. Thus, the difference between the temperature of the first window 33 on the side of the chamber 30 and the temperature thereof on the side of the first optical path tube 51, and the difference between the temperature of the second window 34 on the side of the chamber 30 and the temperature thereof on the side of the second optical path tube 52 can become much smaller. In step S18, the control unit CO may reduce openings of the first gas supply valve SV1 and the second gas supply valve SV2 rather than reducing the opening of the main gas supply valve SV0.

Second Example

Figure 6:
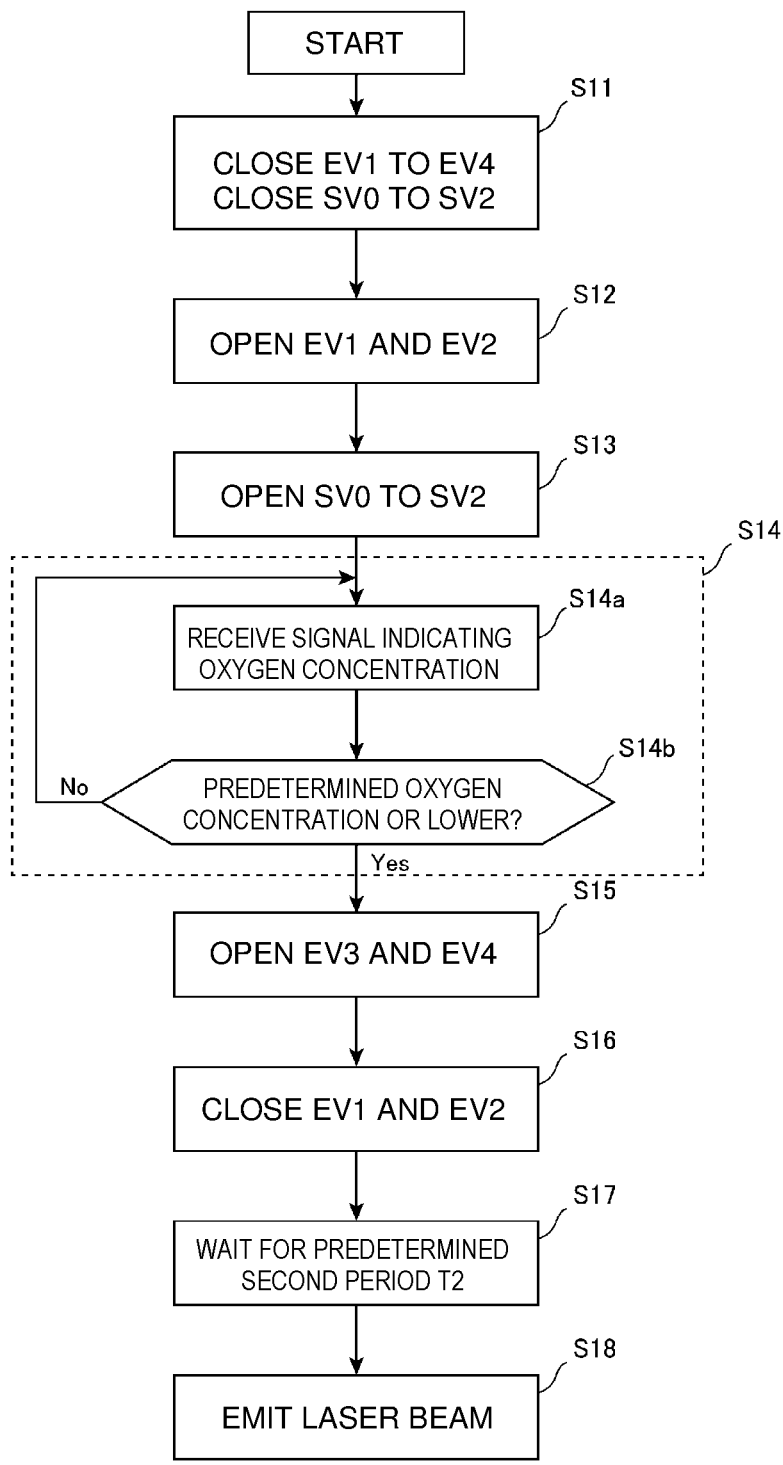
FIG. 6 is a flowchart of a second example of the operation of the control unit until the gas laser apparatus of Embodiment 1 emits the laser beam.

Next, a second example of the operation of the gas laser apparatus 100 of this embodiment will be described. FIG. 6 is a flowchart of a second example of the operation of the control unit CO until the gas laser apparatus 100 of this embodiment emits the laser beam. As shown in FIG. 6, in this example, in the operation of the control unit CO until the laser beam is emitted, step S14 is different from that in the first example, and other steps are the same as those in the first example.

(Step S14)

In this step in this example, the control unit CO maintains the state in step S13 until the oxygen concentration in the first optical path tube 51 and the second optical path tube 52 reaches a predetermined first concentration. Thus, step S14 in this example includes step S14a in which the control unit CO receives a signal indicating the oxygen concentration from the oxygen concentration meter 12, and step S14b in which the control unit CO determines whether or not the received oxygen concentration is the predetermined oxygen concentration or lower.

(Step S14a)

The oxygen concentration meter 12 measures the oxygen concentration of the gases passing through the pipe having the first main exhaust valve EV1 and the pipe having the second main exhaust valve EV2. In this step, the oxygen concentration meter 12 outputs a signal indicating the measured oxygen concentration, and the control unit CO receives the signal.

(Step S14b)

In this step, the control unit CO determines whether or not the oxygen concentration measured by the oxygen concentration meter 12 is the predetermined first concentration or lower according to the signal received from the oxygen concentration meter 12. The predetermined first concentration is, for example, 10 ppm. When the oxygen concentration of the gases passing through the pipe having the first exhaust valve EV1 and the pipe having the second exhaust valve EV2 is not the predetermined first concentration or lower, the control unit CO returns to step S14a, and determines whether or not the oxygen concentration measured by the oxygen concentration meter 12 is the predetermined first concentration or lower according to a signal newly received from the oxygen concentration meter 12.

In this example, the oxygen concentration meter 12 is provided in the different pipe to which the pipe having the first main exhaust valve EV1 and the pipe having the second main exhaust valve EV2 are connected as described above. However, unlike the above example, the oxygen concentration meter 12 may be arranged in each of the first optical path tube 51 and the second optical path tube 52 and measure the oxygen concentration in each of the first optical path tube 51 and the second optical path tube 52. Alternatively, the oxygen concentration meter 12 may be provided in the exhaust duct 11. In a variant in which the oxygen concentration meter 12 is provided in the exhaust duct 11, a procedure of the control unit CO determining if the oxygen concentration in the first optical path tube 51 and the second optical path tube 52 is the predetermined first concentration or lower is, for example, as described below. As described above, at the time of start, air flows into the first optical path tube 51 and the second optical path tube 52. In other words, in the casing 10, the oxygen concentration in the first optical path tube 51 and the second optical path tube 52 is substantially the same as the oxygen concentration outside the first optical path tube 51 and the second optical path tube 52. In step S13 and thereafter, the purge gas is supplied into the first optical path tube 51 and the second optical path tube 52, and the gases in the first optical path tube 51 and the second optical path tube 52 are exhausted into the casing 10. Thus, the oxygen concentration outside the first optical path tube 51 and the second optical path tube 52 in the casing 10 tends to be higher than the oxygen concentration in the first optical path tube 51 and the second optical path tube 52. Then, in this example, when the oxygen concentration in the casing 10 reaches a predetermined second concentration or lower, which is higher than the first concentration, the oxygen concentration in the first optical path tube 51 and the second optical path tube 52 is considered to be the predetermined first concentration or lower. In other words, the second concentration is the oxygen concentration in the casing 10 when the oxygen concentration in the first optical path tube 51 and the second optical path tube 52 is the predetermined first concentration or lower. The second concentration is, for example, 100 ppm.

Then, when the oxygen concentration meter 12 is provided in the exhaust duct 11, the control unit CO goes to step S15 when the oxygen concentration is the second concentration or lower according to a signal received from the oxygen concentration meter 12. When the oxygen concentration is not the second concentration or lower, the control unit CO returns to step S14a, and determines whether or not the oxygen concentration measured by the oxygen concentration meter 12 is the predetermined second concentration or lower according to a signal newly received from the oxygen concentration meter 12. When the oxygen concentration in the casing 10 is the predetermined second concentration or lower, the oxygen concentration in the first optical path tube 51 and the second optical path tube 52 is considered to be the predetermined first concentration or lower. In this case, the control unit CO does not need to determine that the oxygen concentration in the first optical path tube 51 and the second optical path tube 52 is the predetermined first concentration or lower.

In the first example, there is no need to measure the oxygen concentration. Thus, when the control unit CO performs the operation in the first example, the gas laser apparatus 100 does not need to include the oxygen concentration meter 12.

3.3 Effect

In this embodiment, the gases are exhausted through the first main exhaust port EP1 and the second main exhaust port EP2 before the laser beam is emitted. Thus, the gases can flow on the surfaces of the first window 33 and the second window 34 to reduce the oxygen concentration in the casing 21, the first optical path tube 51, and the optical path tube 53, and the oxygen concentration in the casing 41 and the second optical path tube 52. Then, the gases are exhausted through the first auxiliary exhaust port EP3 and the second auxiliary exhaust port EP4. This reduces the amounts of the gases exhausted through the first main exhaust port EP1 and the second main exhaust port EP2, and reduces the amounts of the gases flowing on the surfaces of the first window 33 and the second window 34. Thus, when the laser beam is emitted, the difference between the temperature of the first window 33 on the side of the chamber 30 and the temperature thereof on the side of the first optical path tube 51 becomes smaller, and the difference between the temperature of the second window 34 on the side of the chamber 30 and the temperature thereof on the side of the second optical path tube 52 becomes smaller. Thus, in this embodiment, the temperatures of the surfaces of the first window 33 and the second window 34 on the sides opposite to the chamber 30 become higher than those in the comparative example. Thus, with the gas laser apparatus 100 of this embodiment, even if the first window 33 and the second window 34 are heated when the laser beam is emitted, a smaller thermal shock can be applied on the first window 33 and the second window 34 than in the gas laser apparatus 100 of the comparative example. Also, even if the temperatures of the first window 33 and the second window 34 decrease when the emission of the laser beam is stopped, a smaller thermal shock can be applied on the first window 33 and the second window 34 than in the gas laser apparatus 100 of the comparative example. Thus, the gas laser apparatus of this embodiment can have high durability.

In this embodiment, the control unit CO stops the exhaust of the gases through the first main exhaust port EP1 and the second main exhaust port EP2 when the gases are exhausted through the first auxiliary exhaust port EP3 and the second auxiliary exhaust port EP4. Thus, the difference between the temperature of the first window 33 on the side of the chamber 30 and the temperature thereof on the side of the first optical path tube 51 can be smaller than in the case where the exhaust of the gas through the first main exhaust port EP1 is not stopped when the gas is exhausted through the first auxiliary exhaust port EP3. Similarly, the difference between the temperature of the second window 34 on the side of the chamber 30 and the temperature thereof on the side of the second optical path tube 52 can be smaller than in the case where the exhaust of the gas through the second main exhaust port EP2 is not stopped when the gas is exhausted through the second auxiliary exhaust port EP4. Thus, when the gases are exhausted through the first auxiliary exhaust port EP3 and the second auxiliary exhaust port EP4, the thermal shock applied on the first window 33 and the second window 34 can be further reduced as compared to the case where the exhaust of the gases through the first main exhaust port EP1 and the second main exhaust port EP2 is not stopped. Here, when the gases are exhausted through the first auxiliary exhaust port EP3 and the second auxiliary exhaust port EP4, the gases may also be exhausted through the first main exhaust port EP1 and the second main exhaust port EP2. In this case, for example, when the gases are exhausted through the first auxiliary exhaust port EP3 and the second auxiliary exhaust port EP4, the amounts of the gases through the first main exhaust port EP1 and the second main exhaust port EP2 may be smaller than those before the gases are exhausted through the first auxiliary exhaust port EP3 and the second auxiliary exhaust port EP4.

In the first example of this embodiment, the control unit CO causes the gases to be exhausted through the first auxiliary exhaust port EP3 and the second auxiliary exhaust port EP4 after the predetermined first period T1 from the start of the exhaust of the gases through the first main exhaust port EP1 and the second main exhaust port EP2. Thus, the first period T1 can be properly set to properly reduce the oxygen concentration in the first optical path tube 51 and the oxygen concentration in the second optical path tube 52 using the purge gas.

In the second example of this embodiment, the oxygen concentration of the gases exhausted through the first main exhaust port EP1 and the second main exhaust port EP2 into the casing 10 is directly measured, and the control unit CO causes the gases to be exhausted through the first auxiliary exhaust port EP3 and the second auxiliary exhaust port EP4 when the oxygen concentration in the first optical path tube 51 and the second optical path tube 52 reaches the predetermined first concentration or lower. Thus, in the second example, after the oxygen concentration in the first optical path tube 51 and the second optical path tube 52 is reduced, gas flow paths in the first optical path tube 51 and the second optical path tube 52 can be changed. As in the above variant, the oxygen concentration meter 12 may be provided in the exhaust duct 11, and the gases may be exhausted through the first auxiliary exhaust port EP3 and the second auxiliary exhaust port EP4 when the oxygen concentration in the casing 10 reaches the second concentration or lower. Even in this case, the control unit CO causes the gases to be exhausted through the first auxiliary exhaust port EP3 and the second auxiliary exhaust port EP4 when the exhaust of the gases through the first main exhaust port EP1 and the second main exhaust port EP2 is started and the oxygen concentration in the first optical path tube 51 and the second optical path tube 52 reaches the predetermined first concentration or lower. When the oxygen concentration in the casing 10 is measured, the oxygen concentration meter 12 may be provided in the casing 10 rather than in the exhaust duct 11.

In this embodiment, the control unit CO causes the laser beam to be emitted from the chamber 30 after the exhaust of the gases through the first auxiliary exhaust port EP3 and the second auxiliary exhaust port EP4 is started. This can reduce the thermal shock applied on the first window 33 and the second window 34 from the beginning of emission of the laser beam. If the gases are exhausted through the first auxiliary exhaust port EP3 and the second auxiliary exhaust port EP4 in at least a partial period when emission and stop of the laser beam are repeated, the thermal shock applied on the first window 33 and the second window 34 can be further reduced at the emission and the stop of the laser beam in at least that period. Thus, the control unit CO may start the exhaust of the gases through the first auxiliary exhaust port EP3 and the second auxiliary exhaust port EP4 after the laser beam is emitted.

In this embodiment, the control unit CO causes the laser beam to be emitted from the chamber 30 after the predetermined second period T2 from the start of the exhaust of the gases through the first auxiliary exhaust port EP3 and the second auxiliary exhaust port EP4. Thus, the second period T2 can be properly set to further reduce the thermal shock applied on the first window 33 and the second window 34 from the beginning of the emission of the laser beam. The control unit CO may cause the laser beam to be emitted from the chamber 30 before elapse of the predetermined second period T2 from the start of the exhaust of the gases through the first auxiliary exhaust port EP3 and the second auxiliary exhaust port EP4.

In this embodiment, the position of the first window 33 in the chamber 30 protrudes into the first optical path tube 51 with a gap from an inner wall of the first optical path tube 51. Further, the first main exhaust port EP1 is provided in the position including the plane extending along the first window 33 and perpendicular to the traveling direction of the laser beam in the first optical path tube 51, or in the position closer to the chamber 30 than this plane in the first optical path tube 51. The first main exhaust port EP1 is provided in such a position to allow the gas to properly flow on the surface of the first window 33 when the gas is exhausted through the first main exhaust port EP1. As long as the gas flows on the surface of the first window 33 when the gas is exhausted through the first main exhaust port EP1, the first main exhaust port EP1 may be provided on the side of the plane opposite to the chamber, and the first window 33 does not need to protrude into the first optical path tube 51.

In this embodiment, the position of the second window 34 in the chamber 30 protrudes into the second optical path tube 52 with a gap from an inner wall of the second optical path tube 52. Further, the second main exhaust port EP2 is provided in the position including the plane extending along the second window 34 and perpendicular to the traveling direction of the laser beam in the second optical path tube 52, or in the position closer to the chamber 30 than this plane in the second optical path tube 52. The second main exhaust port EP2 is provided in such a position to allow the gas to properly flow on the surface of the second window 34 when the gas is exhausted through the second main exhaust port EP2. As long as the gas flows on the surface of the second window 34 when the gas is exhausted through the second main exhaust port EP2, the second main exhaust port EP2 may be provided on the side of the plane opposite to the chamber, and the second window 34 does not need to protrude into the second optical path tube 52.

In this embodiment, an optical element that the laser beam enters is arranged upstream of the flow of the gas with respect to the first auxiliary exhaust port EP3. In this embodiment, at least an output coupling mirror OC1 and a beam splitter 22 are arranged as optical elements. Also in this embodiment, an optical element that the laser beam enters is arranged upstream of the flow of the gas with respect to the second auxiliary exhaust port EP4. In this embodiment, a grating 42 and prisms 43, 44 are arranged as optical elements. Thus, even if the exhaust of the gases through the first main exhaust port EP1 and the second main exhaust port EP2 is stopped, the gases are exhausted through the first auxiliary exhaust port EP3 and the second auxiliary exhaust port EP4, thereby reducing the oxygen concentration in spaces in which the optical elements are arranged.

The gas laser apparatus 100 of this embodiment includes the first auxiliary exhaust valve EV3 and the first auxiliary exhaust port EP3, and the second auxiliary exhaust valve EV4 and the second auxiliary exhaust port EP4. However, the gas laser apparatus 100 does not need to include either the first auxiliary exhaust valve EV3 and the first auxiliary exhaust port EP3 or the second auxiliary exhaust valve EV4 and the second auxiliary exhaust port EP4. The first window 33 transmits the laser beam with higher power than the second window 34, and thus in this case, the gas laser apparatus 100 preferably includes the first auxiliary exhaust valve EV3 and the first auxiliary exhaust port EP3.

4. Description of Gas Laser Apparatus of Embodiment 2

Next, a gas laser apparatus of Embodiment 2 will be described. The same components as those described above are denoted by the same reference numerals, and overlapping descriptions are omitted unless otherwise stated.

4.1 Configuration

Figure 7:
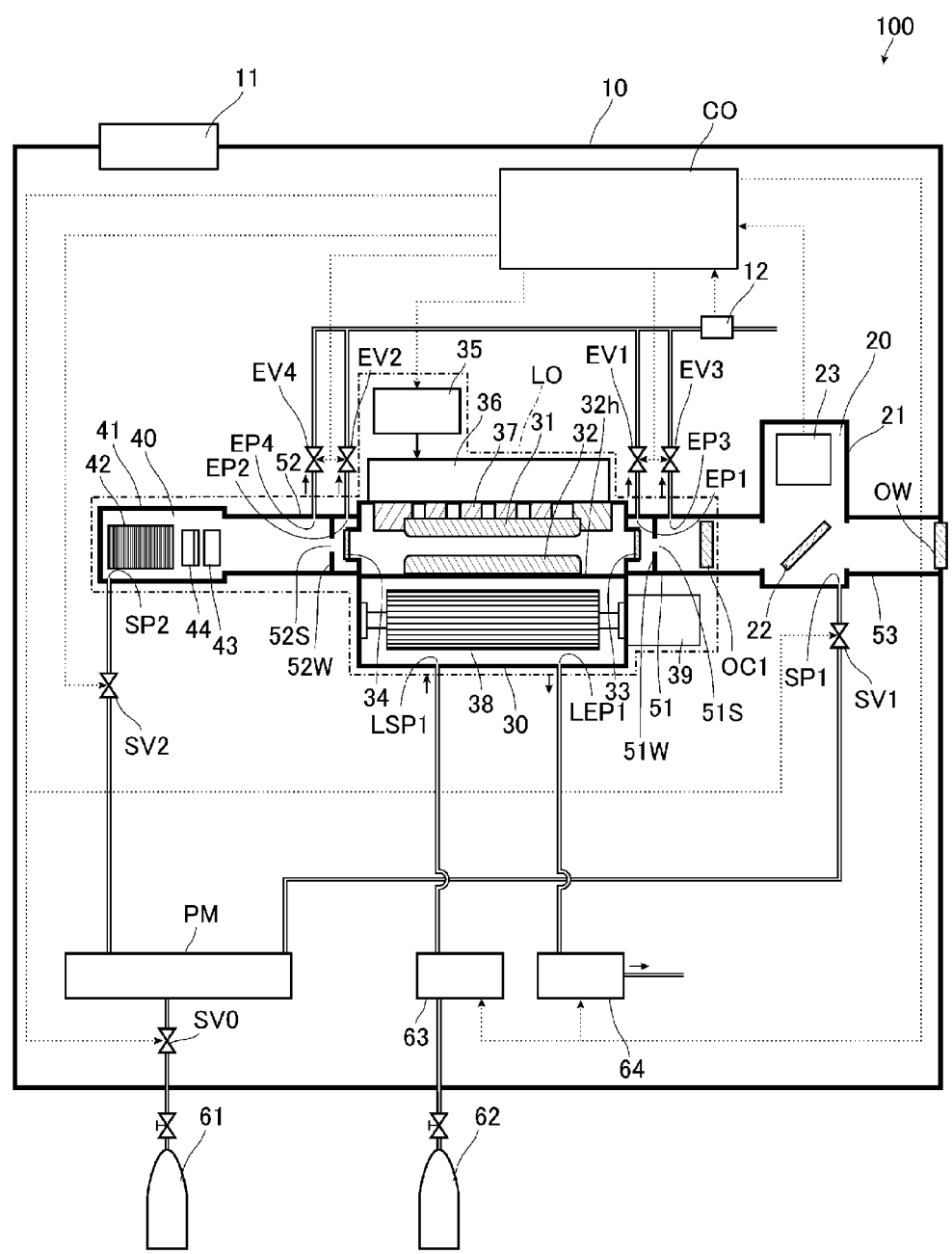
FIG. 7 is a schematic diagram of an exemplary configuration of the entire gas laser apparatus of Embodiment 2.

FIG. 7 is a schematic diagram of an exemplary configuration of the entire gas laser apparatus of this embodiment. As shown in FIG. 7, a gas laser apparatus 100 of this embodiment is different from the gas laser apparatus of Embodiment 1 in including a first wall 51W and a second wall 52W.

The first wall 51W is provided between the first main exhaust port EP1 and the first auxiliary exhaust port EP3 in the first optical path tube 51, and closes the first optical path tube 51. The first wall 51W has a first slit 51S. The first slit 51S is formed such that the laser beam propagating between the first window 33 and the output coupling mirror OC1 can pass through the first slit 51S. The first slit 51S preferably has a shape substantially similar to a sectional shape of the laser beam passing through the first slit 51S such that the first slit 51S has no unnecessary region.

The second wall 52W is provide between the second main exhaust port EP2 and the second auxiliary exhaust port EP4 in the second optical path tube 52, and closes the second optical path tube 52. The second wall 52W has a second slit 52S. The second slit 52S is formed such that the laser beam propagating between the second window 34 and the line narrowing module 40 can pass through the second slit 52S. The second slit 52S preferably has a shape substantially similar to a sectional shape of the laser beam passing through the second slit 52S such that the second slit 52S has no unnecessary region.

The first wall 51W and the second wall 52W are preferably made of, for example, metal to prevent outgassing, and examples of the metal include aluminum and stainless steel.

4.2 Operation

An operation of the gas laser apparatus 100 of this embodiment is the same as that of the gas laser apparatus 100 of Embodiment 1. However, when the gas is exhausted through the first main exhaust port EP1, the gas in the first optical path tube 51 flows through the first slit 51S and on the surface of the first window 33, and is exhausted through the first main exhaust port EP1. Also, when the gas is exhausted through the second main exhaust port EP2, the gas in the second optical path tube 52 flows through the second slit 52S and on the surface of the second window 34, and is exhausted through the second main exhaust port EP2.

4.3 Effect

In the gas laser apparatus 100 of this embodiment, the first wall 51W serves as a barrier to suppress flowing of the gas to the first window 33 when the gas is exhausted through the first auxiliary exhaust port EP3. Also, the second wall 52W serves as a barrier to suppress flowing of the gas to the second window 34 when the gas is exhausted through the second auxiliary exhaust port EP4. This can further reduce the thermal shock applied on the first window 33 and the second window 34.

The gas laser apparatus 100 does not need to include either the first wall 51W or the second wall 52W. When the gas laser apparatus 100 does not include either the first wall 51W or the second wall 52W, the gas laser apparatus 100 preferably includes the first wall 51W because the first window 33 transmits the laser beam with higher power than the second window 34.

5. Description of Gas Laser Apparatus of Embodiment 3

Next, a gas laser apparatus of Embodiment 3 will be described. The same components as those described above are denoted by the same reference numerals, and overlapping descriptions are omitted unless otherwise stated.

5.1 Configuration

Figure 8:
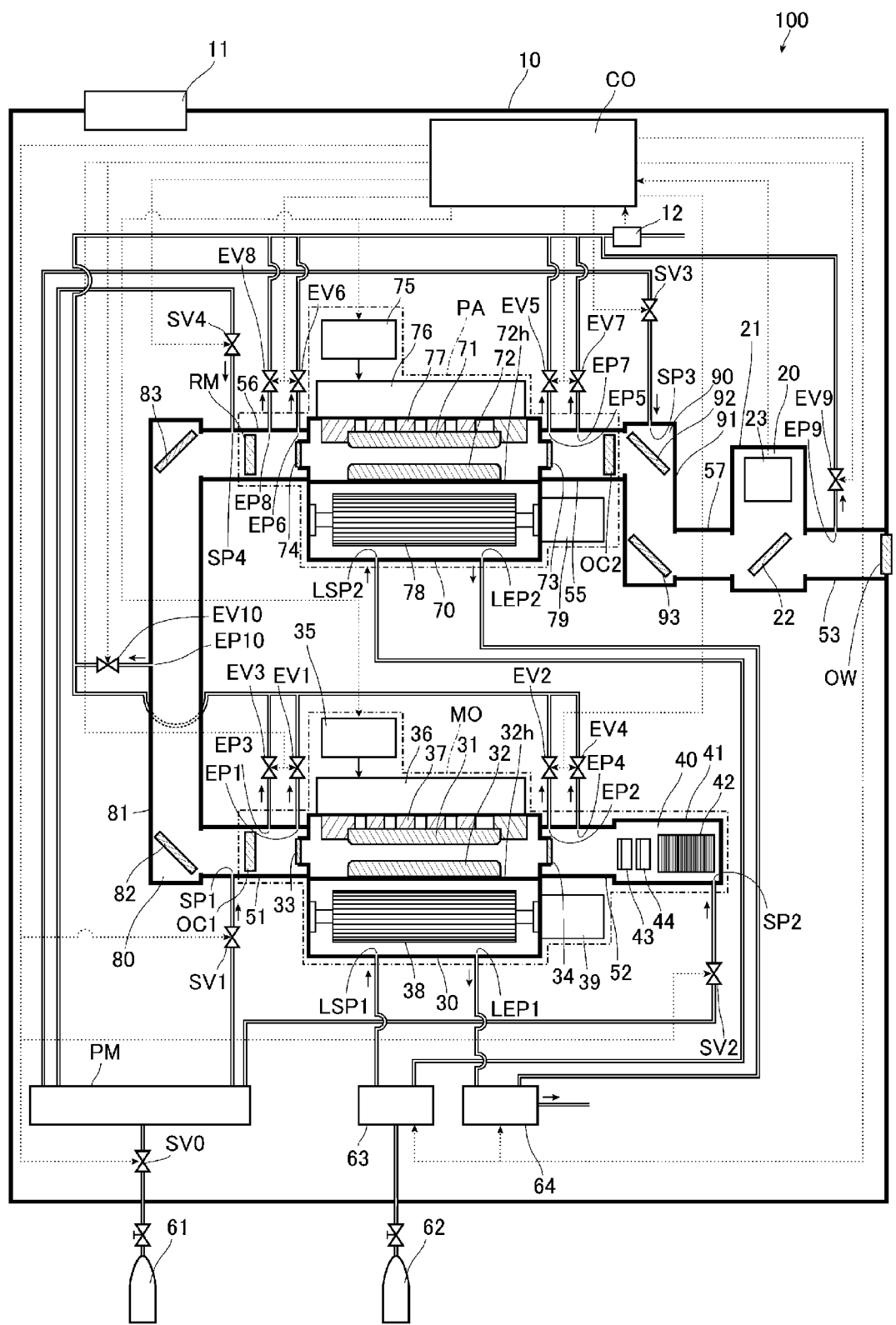
FIG. 8 is a schematic diagram of an exemplary configuration of the entire gas laser apparatus of Embodiment 3.

FIG. 8 is a schematic diagram of an exemplary configuration of the entire gas laser apparatus of this embodiment. As shown in FIG. 8, the gas laser apparatus 100 of this embodiment is mainly different from the gas laser apparatus 100 of Embodiment 1 in including a master oscillator MO similar to the laser oscillator LO in Embodiment 1 and further including an amplifier PA and optical transmission units 80, 90.

The amplifier PA mainly includes a chamber 70, a window including a first window 73 and a second window 74, a pair of electrodes 71, 72, an electrode holder 72h, a charger 75, a pulse power module 76, an insulating portion 77, a cross flow fan 78, a motor 79, a rear mirror RM, and an output coupling mirror OC2.

Configurations of the chamber 70, the electrodes 71, 72, the electrode holder 72h, and the insulating portion 77 in the amplifier PA are the same as those of the chamber 30, the electrodes 31, 32, the electrode holder 32h, and the insulating portion 37 in the master oscillator MO. The electrodes 71,72 are arranged to face each other in the chamber 70. The insulating portion 77 closes an opening formed in the chamber 70, and the electrode 71 is supported by the insulating portion 77. The electrode 72 is supported by the electrode holder 72h, and the electrode holder 72h is secured to an inner surface of the chamber 70 and electrically connected to the chamber 70.

Configurations of the charger 75 and the pulse power module 76 in the amplifier PA are the same as those of the charger 35 and the pulse power module 36 in the master oscillator MO. Thus, a feedthrough of the insulating portion 77 applies a voltage supplied from the pulse power module 76 to the electrode 71. The pulse power module 76 increases a voltage applied from the charger 75 to generate a pulsed high voltage, and applies the high voltage between the electrodes 71, 72.

Configurations of the cross flow fan 78 and the motor 79 in the amplifier PA are the same as those of the cross flow fan 38 and the motor 39 in the master oscillator MO. Thus, the cross flow fan 78 is arranged in the chamber 70, and a space in which the cross flow fan 78 is arranged communicates with a space in which the electrodes 71, 72 are arranged in the chamber 70. The cross flow fan 78 rotates to circulate the laser gas filing the chamber 70 in a predetermined direction. The motor 79 is connected to the cross flow fan 78, and the motor 79 rotates to rotate the cross flow fan 78. The control unit CO can control the motor 79 to adjust a circulation speed of the laser gas circulating in the chamber 70.

Configurations of the first window 73 and the second window 74 are the same as those of the first window 33 and the second window 34 in the master oscillator MO. Thus, the first window 73 and the second window 74 are arranged to face each other with a space therebetween, the space being between the electrode 71 and the electrode 72 in the chamber 70. The first window 73 is provided at one end of the chamber 70 in the traveling direction of the laser beam, and the second window 74 is provided at the other end of the chamber 70 in the traveling direction of the laser beam. As described later, in the gas laser apparatus 100, light oscillates in an optical path including the chamber 70 to emit the laser beam, and thus the laser beam generated in the chamber 70 is emitted through the first window 73 and the second window 74 to the outside of the chamber 70.

A first optical path tube 55 is connected to the one end of the chamber 70 at which the first window 73 is provided. A position of the first window 73 in the chamber 70 protrudes into the first optical path tube 55 with a gap from an inner wall of the first optical path tube 55. Thus, the first window 73 is located in the first optical path tube 55.

A configuration of the output coupling mirror OC2 is the same as that of the output coupling mirror OC1 in the master oscillator MO. The output coupling mirror OC2 is provided on the one end side of the chamber 70, and arranged in the first optical path tube 55. The output coupling mirror OC2 is an optical element that the laser beam emitted through the first window 73 enters. The output coupling mirror OC2 transmits one part of the laser beam emitted through the first window 73, and reflects and returns the other part through the first window 73 into the chamber 70.

A second optical path tube 56 is connected to the other end side of the chamber 70 at which the second window 74 is provided. In other words, the optical path tube connected to the chamber 70 includes the first optical path tube 55 and the second optical path tube 56. A position of the second window 74 in the chamber 70 protrudes into the second optical path tube 56 with a gap from an inner wall of the second optical path tube 56. Thus, the second window 74 is located in the second optical path tube 56.

The rear mirror RM is provided on the other end side of the chamber 70, and arranged in the second optical path tube 56. The rear mirror RM is an optical element that the laser beam emitted through the second window 74 enters. The rear mirror RM reflects at least one part of the laser beam emitted through second window 74 and returns the laser beam through the second window 74 into the chamber 70. The rear mirror RM also transmits light incident from the side opposite to the chamber 70 and causes the beam to enter the chamber 70 through the second window 74. The rear mirror RM is formed of, for example, an element including a calcium fluoride substrate coated with a dielectric multilayer film.

The output coupling mirror OC2 and the rear mirror RM with the chamber 70 therebetween constitute an optical resonator, and the chamber 70 is arranged in an optical path of the optical resonator. Thus, the light entering the chamber 70 through the rear mirror RM reciprocates between the output coupling mirror OC2 and the rear mirror RM and is amplified every time it passes through a laser gain space between the electrodes 71, 72. Part of the amplified light passes through the output coupling mirror OC2, and an amplified laser beam is emitted. Examples of the amplifier PA include an injection lock amplifier.

The first optical path tube 51 in the master oscillator MO is connected to the second optical path tube 56 in the amplifier PA via the optical transmission unit 80. The optical transmission unit 80 includes a casing 81 and a pair of mirrors 82, 83. The connecting portion of the casing 81 to the first optical path tube 51 is open, and through the opening, a space in the casing 81 communicates with a space in the first optical path tube 51. The connecting portion of the casing 81 to the second optical path tube 56 is open, and through the opening, the space in the casing 81 communicates with a space in the second optical path tube 56. The mirrors 82, 83 are arranged at appropriately adjusted angles in the casing 81. The laser beam emitted through the output coupling mirror OC1 in the master oscillator MO is reflected by the mirrors 82, 83 and enters the rear mirror RM in the amplifier PA. At least part of the laser beam passes through the rear mirror RM.

The first optical path tube 55 in the amplifier PA is connected to the casing 21 of the energy monitor module 20 via the optical transmission unit 90 and an optical path tube 57. The optical transmission unit 90 includes a casing 91 and a pair of mirrors 92, 93. The connecting portion of the casing 91 to the first optical path tube 55 is open, and through the opening, a space in the casing 91 communicates with a space in the first optical path tube 55. The connecting portion of the casing 91 to the optical path tube 57 is open, and through the opening, a space in the casing 91 communicates with a space in the optical path tube 57. The casing 21 of the energy monitor module 20 is connected to the optical path tube 57. Through an opening formed in the casing 21, a space in the casing 21 communicates with the space in the optical path tube 57. The mirrors 92, 93 are arranged at appropriately adjusted angles in the casing 91. The laser beam emitted through the output coupling mirror OC2 in the amplifier PA is reflected by the mirrors 92, 93 and enters the energy monitor module through the optical path tube 57. Thus, in this embodiment, the beam splitter 22 and the pulse energy sensor 23 in the energy monitor module 20 are optical elements that the laser beam emitted through the first window 73 in the amplifier PA enters.

As in Embodiment 1, the optical path tube 53 is connected to the casing 21 of the energy monitor module 20, and connected to the casing 10. Further, a laser beam exit window OW is provided in a position of the casing 10 surrounded by the optical path tube 53.

In this embodiment, the pipe having a first gas supply valve SV1 for the master oscillator MO is connected to the first optical path tube 51. Thus, a first gas supply port SP1 for the master oscillator MO is provided in the first optical path tube 51. As described above, the space in the casing 81 communicates with the space in the first optical path tube 51, and thus the first gas supply port SP1 supplies a purge gas through the first optical path tube 51 into the casing 81 of the optical transmission unit 80.

A plurality of pipes other than those described in Embodiment 1 are connected to the purge gas manifold PM, and a first gas supply valve SV3 for the amplifier PA is provided in the middle of one of the pipes. Opening of the first gas supply valve SV3 is adjusted according to a control signal from the control unit CO. The pipe having the first gas supply valve SV3 is connected to the casing 91 of the optical transmission unit 90. The connecting portion is a first gas supply port SP3 for the amplifier PA that supplies the purge gas into the casing 91. Thus, the first gas supply port SP3 supplies the purge gas through the casing 91 into the first optical path tube 55, the optical path tube 57, the casing 21, and the optical path tube 53.

A second gas supply valve SV4 for the amplifier PA is provided in the middle of another pipe connected to the purge gas manifold PM. Opening of the second gas supply valve SV4 is adjusted according to a control signal from the control unit CO. The pipe having the second gas supply valve SV4 is connected to the second optical path tube 56. The connecting portion is a second gas supply port SP4 that supplies the purge gas into the second optical path tube 56.

Thus, the second gas supply port SP4 supplies the purge gas through the second optical path tube 56 into the casing 81 of the optical transmission unit 80.

In other words, the gas supply port for the amplifier PA in the gas laser apparatus 100 of this example includes the first gas supply port SP3 and the second gas supply port SP4.

A pipe having a first main exhaust valve EV5 is connected to the first optical path tube 55 in the amplifier PA. Opening of the first main exhaust valve EV5 is adjusted according to a control signal from the control unit CO. The first main exhaust valve EV5 opens to exhaust the gas in the first optical path tube 55. The connecting portion of the pipe having the first main exhaust valve EV5 to the first optical path tube 55 is a first main exhaust port EP5 that exhausts the gas in the first optical path tube 55. In this example, the first main exhaust port EP5 is provided beside the first window 73 in the first optical path tube 55. Specifically, the first main exhaust port EP5 is provided in a position including a plane extending along the first window 73 and perpendicular to the traveling direction of the laser beam in the first optical path tube 55. The first main exhaust port EP5 may be provided closer to the chamber 70 than this plane in the first optical path tube 55. Specifically, the first main exhaust port EP5 may be provided near the first window 73 in the first optical path tube 55. The purge gas supplied through the first gas supply port SP3 is mixed with the gas in the casing 91 and the first optical path tube 55, and flows to the first main exhaust port EP5. Thus, the purge gas can reduce an oxygen concentration in the casing 91 and the first optical path tube 55. In other words, the first main exhaust port EP5 is provided in the first optical path tube 55 such that the gas flows on surfaces of the mirror 92, the output coupling mirror OC2, and the first window 73.

A pipe having a first auxiliary exhaust valve EV7 is further connected to the first optical path tube 55 in the amplifier PA. Opening of the first auxiliary exhaust valve EV7 is adjusted according to a control signal from the control unit CO. The connecting portion of the pipe having the first auxiliary exhaust valve EV7 to the first optical path tube 55 is a first auxiliary exhaust port EP7 that exhausts the gas in the first optical path tube 55. In other words, the first exhaust port provided in the first optical path tube 55 in this embodiment includes the first main exhaust port EP5 as a main exhaust port and the first auxiliary exhaust port EP7 as an auxiliary exhaust port. The first auxiliary exhaust valve EV7 opens to exhaust the gas in the first optical path tube 55 through the first auxiliary exhaust port EP7. In this example, the first auxiliary exhaust port EP7 is provided upstream of a flow of the gas in the first optical path tube 55 with respect to a position of the first window 73 and a position of the first main exhaust port EP5. Thus, when the first main exhaust port EP5 is provided in the position including the plane extending along the first window 73 and perpendicular to the traveling direction of the laser beam in the first optical path tube 55, the first auxiliary exhaust port EP7 is provided upstream of the flow of the gas in the first optical path tube 55 with respect to the first main exhaust port EP5. Alternatively, when the first main exhaust port EP5 is provided closer to the chamber 70 than this plane, the first auxiliary exhaust port EP7 is provided upstream of the flow of the gas in the first optical path tube 55 with respect to the position of the first window 73.

The pipe having the first main exhaust valve EV5 and the pipe having the first auxiliary exhaust valve EV7 are connected to a different pipe to which the pipe having the first main exhaust valve EV1 and the pipe having the second main exhaust valve EV2 in the master oscillator MO are connected. Thus, the gas in the first optical path tube 55 exhausted through the first main exhaust port EP5 or the first auxiliary exhaust port EP7 is exhausted through the different pipe into the casing 10.

A pipe having a second main exhaust valve EV6 is connected to the second optical path tube 56 in the amplifier PA. Opening of the second main exhaust valve EV6 is adjusted according to a control signal from the control unit CO. The second main exhaust valve EV6 opens to exhaust the gas in the second optical path tube 56. The connecting portion of the pipe having the second main exhaust valve EV6 to the second optical path tube 56 is a second main exhaust port EP6 that exhausts the gas in the second optical path tube 56. In this example, the second main exhaust port EP6 is provided beside the second window 74 in the second optical path tube 56. Specifically, the second main exhaust port EP6 is provided in a position including a plane extending along the second window 74 and perpendicular to the traveling direction of the laser beam in the second optical path tube 56. The second main exhaust port EP6 may be provided closer to the chamber 70 than this plane in the second optical path tube 56. Specifically, the second exhaust port EP6 may be provided near the second window 74 in the second optical path tube 56. The purge gas supplied through the second gas supply port SP4 is mixed with the gas in the casing 41 and the second optical path tube 56, and flows to the second main exhaust port EP6. Thus, the purge gas can reduce an oxygen concentration in the casing 41 and the second optical path tube 56. In other words, the second main exhaust port EP6 is provided in the second optical path tube 56 such that the purge gas flows on surfaces of the rear mirror RM and the second window 74.

A pipe having a second auxiliary exhaust valve EV8 is further connected to the second optical path tube 56 in the amplifier PA. Opening of the second auxiliary exhaust valve EV8 is adjusted according to a control signal from the control unit CO. The connecting portion of the pipe having the second auxiliary exhaust valve EV8 to the second optical path tube 56 is a second auxiliary exhaust port EP8 that exhausts the gas in the second optical path tube 56. In other words, the second exhaust port provided in the second optical path tube 56 in this embodiment includes the second main exhaust port EP6 as a main exhaust port and the second auxiliary exhaust port EP8 as an auxiliary exhaust port. Thus, the second auxiliary exhaust valve EV8 opens to exhaust the gas in the second optical path tube 56 through the second auxiliary exhaust port EP8. In this example, the second auxiliary exhaust port EP8 is provided upstream of a flow of the gas in the second optical path tube 56 with respect to a position of the second window 74 and a position of the second main exhaust port EP6. Thus, when the second main exhaust port EP6 is provided in a position including a plane extending along the second window 74 and perpendicular to the traveling direction of the laser beam in the second optical path tube 56, the second auxiliary exhaust port EP8 is provided upstream of the flow of the gas in the second optical path tube 56 with respect to the second main exhaust port EP6. Alternatively, when the second main exhaust port EP6 is provided closer to the chamber 70 than this plane, the second auxiliary exhaust port EP8 is provided upstream of the flow of the gas in the second optical path tube 56 with respect to the position of the second window 74.

The pipe having the second main exhaust valve EV6 and the pipe having the second auxiliary exhaust valve EV8 are connected to the different pipe to which the pipe having the first main exhaust valve EV1 and the pipe having the second main exhaust valve EV2 in the master oscillator MO are connected. Thus, the gas in the second optical path tube 56 exhausted through the second main exhaust port EP6 or the second auxiliary exhaust port EP8 is exhausted through the different pipe into the casing 10.

A pipe having an exhaust valve EV9 is further connected to the optical path tube 53 in the amplifier PA. Opening of the exhaust valve EV9 is adjusted according to a control signal from the control unit CO. The connecting portion of the pipe having the exhaust valve EV9 to the optical path tube 53 is an exhaust port EP9 that exhausts the gas in the optical path tube 53. Thus, the exhaust valve EV9 opens to exhaust the gas in the optical path tube 53 through the exhaust port EP9. Thus, part of the purge gas supplied through the first gas supply port SP3 is mixed with the gas in the casing 91, the optical path tube 57, the casing 21, and the optical path tube 53, and flows to the exhaust port EP9. The pipe having the exhaust valve EV9 is connected to the different pipe to which the pipe having the first main exhaust valve EV1 and the pipe having the second main exhaust valve EV2 in the master oscillator MO are connected. Thus, the gas in the optical path tube 53 exhausted through the exhaust port EP9 is exhausted through the different pipe into the casing 10.

A pipe having an exhaust valve EV10 is connected substantially midway between the connecting portion of the casing 81 of the optical transmission unit 80 to the first optical path tube 51 and the connecting portion thereof to the second optical path tube 56. Opening of the exhaust valve EV10 is adjusted according to a control signal from the control unit CO. The connecting portion of the pipe having the exhaust valve EV10 to the casing 81 is an exhaust port EP10 that exhausts the gas in the casing 81. Thus, the exhaust valve EV10 opens to exhaust the gas in the casing 81 through the exhaust port EP10. Thus, part of the purge gas supplied through the first gas supply port SP1 into the first optical path tube 51 and part of the purge gas supplied through the second gas supply port SP4 into the second optical path tube 56 are mixed with the gas in the casing 81, and exhausted through the exhaust port EP10. The pipe having the exhaust valve EV10 is connected to the different pipe to which the pipe having the first main exhaust valve EV1 and the pipe having the second main exhaust valve EV2 in the master oscillator MO are connected. Thus, the gas in the casing 81 exhausted through the exhaust port EP10 is exhausted through the different pipe into the casing 10.

In this embodiment, to the laser gas supply device 63, a pipe connected to the chamber 70 is connected in addition to the pipe connected to the chamber 30. Thus, the laser gas supply device 63 supplies the laser gas through this pipe into the chamber 70. The connecting portion of this pipe to the chamber 70 is a laser gas supply port LSP2 that supplies the laser gas into the chamber 70.

To the exhaust device 64 in this embodiment, a pipe connected to the chamber 70 is connected in addition to the pipe connected to the chamber 30. Thus, the exhaust device 64 exhausts the gas in the chamber 30 and also the gas in the chamber 70 through the pipe into the casing 10. In this case, the exhaust device 64 adjusts an exhaust amount or the like according to a control signal from the control unit CO, and removes an $F_2$ gas from the gases exhausted from the chamber 30 and the chamber 70 using a halogen filter (not shown). The connecting portion, to the chamber 70, of the pipe connected to the exhaust device 64 is a laser gas exhaust port LEP2 that exhausts the gas from the chamber 70.

5.2 Operation

First Example

Figure 9:
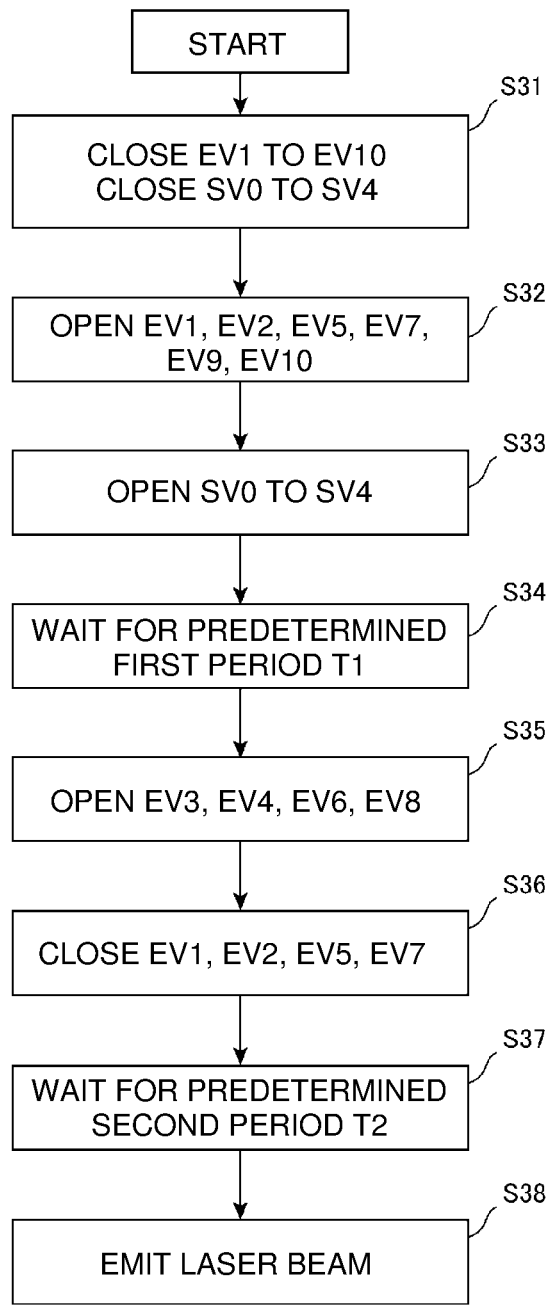
FIG. 9 is a flowchart of a first example of an operation of a control unit until the gas laser apparatus of Embodiment 3 emits a laser beam.

First, a first example of an operation of the gas laser apparatus 100 of this embodiment will be described. FIG. 9 is a flowchart of a first example of an operation of the control unit CO until the gas laser apparatus 100 of this embodiment emits a laser beam. As shown in FIG. 9, in this example, the operation of the control unit CO until the laser beam is emitted includes step S31 to step S38.

(Step S31)

In introduction or maintenance of the gas laser apparatus 100, for example, air flows into the first optical path tube 51 and the second optical path tube 52 in the master oscillator MO and into the first optical path tube 55 and the second optical path tube 56 in the amplifier PA. This is a state of start in FIG. 9.

In this step, as in step S11 in Embodiment 1, the control unit CO closes the first main exhaust valve EV1, the second main exhaust valve EV2, the first auxiliary exhaust valve EV3, the second auxiliary exhaust valve EV4, the main gas supply valve SV0, the first gas supply valve SV1, and the second gas supply valve SV2. Further, in this embodiment, the control unit CO closes the first main exhaust valve EV5, the second main exhaust valve EV6, the first auxiliary exhaust valve EV7, the second auxiliary exhaust valve EV8, the first gas supply valve SV3, and the second gas supply valve SV4. Further, the control unit CO closes the exhaust valve EV9 and the exhaust valve EV10.

Thus, in this step, no purge gas is supplied into the first optical path tube 51 and the second optical path tube 52 in the master oscillator MO, and no gas is exhausted through the first optical path tube 51 and the second optical path tube 52. Also in this step, no purge gas is supplied into the first optical path tube 55 and the second optical path tube 56 in the amplifier PA, and no gas is exhausted through the first optical path tube 55 and the second optical path tube 56. When any of the valves is open at the time of start, the control unit CO closes the open valve in this step. When all the valves are closed at the time of start, the control unit CO keeps the valves closed.

(Step S32)

In this step, as in step S12 in Embodiment 1, the control unit CO opens the first main exhaust valve EV1 and the second main exhaust valve EV2 for the master oscillator MO. Further, in this embodiment, the control unit CO opens the first main exhaust valve EV5 and the second main exhaust valve EV6 for the amplifier PA, and the exhaust valve EV9 and the exhaust valve EV10. At this time, no purge gas is supplied because the gas supply valves are closed, and the gases in the first optical path tube 51, the second optical path tube 52, the first optical path tube 55, and the second optical path tube 56 are not exhausted.

(Step S33)

In this step, as in step S13 in Embodiment 1, the control unit CO opens the main gas supply valve SV0, and the first gas supply valve SV1 and the second gas supply valve SV2 for the master oscillator MO. Thus, the purge gas is supplied through the first gas supply port SP1 into the first optical path tube 51, and the purge gas is supplied through the second gas supply port SP2 into the casing 41. The control unit CO also opens the first gas supply valve SV3 and the second gas supply valve SV4 for the amplifier PA. Thus, the purge gas is supplied through the first gas supply port SP3 into the casing 91, and the purge gas is supplied through the second gas supply port SP4 into the second optical path tube 56.

In this step, as in step S13 in Embodiment 1, the gas flows on the surfaces of the output coupling mirror OC1 and the first window 33, and the purge gas reduces the oxygen concentration in the first optical path tube 51. Also, the gas flows on the surfaces of the grating 42, the prisms 43, 44, and the second window 34, and the purge gas reduces the oxygen concentration in the casing 41 and the second optical path tube 52.

In step S32, the first main exhaust valve EV5 and the second main exhaust valve EV6 for the amplifier PA are opened. Thus, the gas in the casing 91 and the first optical path tube 55 is pushed out by the purge gas, and exhausted through the first main exhaust port EP5 into the casing 10. At this time, the gas flows on the surfaces of the mirror 92, the output coupling mirror OC2, and the first window 73, and the purge gas reduces the oxygen concentration in the casing 91 and the first optical path tube 55. Also, the gas in the second optical path tube 56 is pushed out by the purge gas, and exhausted through the second main exhaust port EP6 into the casing 10. At this time, the gas flows on the surfaces of the rear mirror RM and the second window 74, and the purge gas reduces the oxygen concentration in the second optical path tube 56. In other words, in this step, the control unit CO causes the gas to be exhausted through the first main exhaust port EP5 and the second main exhaust port EP6 as the main exhaust ports before the laser beam is emitted from the chamber 70.

Also in step S32, the exhaust valve EV9 is opened. Thus, the gas in the casing 91 of the optical transmission unit 90, the optical path tube 57, the casing 21 of the energy monitor module 20, and the optical path tube 53 is pushed out by the purge gas supplied through the first gas supply port SP3, and exhausted through the exhaust port EP9 into the casing 10. At this time, the gas flows on the surfaces of the mirrors 92, 93 and the beam splitter 22, and the purge gas reduces the oxygen concentration in the casing 91 of the optical transmission unit 90, the optical path tube 57, the casing 21 of the energy monitor module 20, and the optical path tube 53.

Also in step S32, the exhaust valve EV10 is opened. Thus, part of the gas in the first optical path tube 51 in the master oscillator MO and part of the gas in the casing 81 are pushed out by the purge gas supplied through the first gas supply port SP1, and exhausted through the exhaust port EP10 into the casing 10. Also, part of the gas in the second optical path tube 56 in the amplifier PA and part of the gas in the casing 81 are pushed out by the purge gas supplied through the second gas supply port SP4, and exhausted through the exhaust port EP10 into the casing 10. At this time, the gas flows on the surfaces of the mirrors 82, 83, and the purge gas reduces the oxygen concentration in the casing 81.

(Step S34)

In this step, as in step S14 in Embodiment 1, the control unit CO maintains the state in step S33 for a predetermined first period T1. In this step, the oxygen concentration in the first optical path tube 51, the second optical path tube 52, and the casing 41 in the master oscillator MO reaches a predetermined concentration or lower. Also, the oxygen concentration in the first optical path tube 55 and the second optical path tube 56 in the amplifier PA reaches a predetermined concentration or lower. Also, the oxygen concentration in the casing 81 of the optical transmission unit 80, the casing 91 of the optical transmission unit 90, the optical path tube 57, the casing 21 of the energy monitor module 20, and the optical path tube 53 reaches a predetermined concentration or lower.

(Step S35)

In this step, the control unit CO opens the first auxiliary exhaust valve EV3 and the second auxiliary exhaust valve EV4 for the master oscillator MO. Thus, as in step S15 in Embodiment 1, amounts of the gases exhausted through the first main exhaust port EP1 and the second main exhaust port EP2 decrease as compared to the state before this step. Thus, the flows of the gases in the first optical path tube 51 and the second optical path tube 52 change to reduce amounts of the gases flowing on the surfaces of the first window 33 and the second window 34.

In this step, the control unit CO opens the first auxiliary exhaust valve EV7 and the second auxiliary exhaust valve EV8 for the amplifier PA. In step S32, the first main exhaust valve EV5 and the second main exhaust valve EV6 are opened. Thus, the gas in the first optical path tube 55 is exhausted through the first main exhaust port EP5 and the first auxiliary exhaust port EP7 into the casing 10, and the gas in the second optical path tube 56 is exhausted through the second main exhaust port EP6 and the second auxiliary exhaust port EP8 into the casing 10. In other words, in this step, the gas is exhausted through the first auxiliary exhaust port EP7 and the second auxiliary exhaust port EP8 as the auxiliary exhaust ports. Thus, amounts of the gases exhausted through the first main exhaust port EP5 and the second main exhaust port EP6 decrease as compared to the state before this step. Thus, the flows of the gases in the first optical path tube 55 and the second optical path tube 56 change to reduce amounts of the gases flowing on the surfaces of the first window 73 and the second window 74.

(Step S36)

In this step, the control unit CO closes the first main exhaust valve EV1 and the second main exhaust valve EV2 for the master oscillator MO. Thus, as in step S16 in Embodiment 1, amounts of the gases exhausted through the first auxiliary exhaust port EP3 and the second auxiliary exhaust port EP4 increase. Thus, the flows of the gases in the first optical path tube 51 and the second optical path tube 52 further change to further reduce the amounts of the gases flowing on the surfaces of the first window 33 and the second window 34.

In this step, the control unit CO closes the first main exhaust valve EV5 and the second main exhaust valve EV6 for the amplifier PA. Thus, no gas is exhausted through the first main exhaust port EP5 and the second main exhaust port EP6, and amounts of the gases exhausted through the first auxiliary exhaust port EP7 and the second auxiliary exhaust port EP8 increase. Thus, the flows of the gases in the first optical path tube 55 and the second optical path tube 56 further change to further reduce the amounts of the gases flowing on the surfaces of the first window 73 and the second window 74.

In this embodiment, before completion of step S37, the control unit CO causes the laser gas to be supplied into the chamber 30 and the chamber 70 and causes the supplied laser gas to be circulated. In this embodiment, a procedure of the laser gas being supplied into the chamber 30 and circulated is the same as that in the comparative example. A procedure of the laser gas being supplied into the chamber 70 and circulated is as described below. The control unit CO controls the exhaust device 64 to exhaust the gas in the chamber 70 through the laser gas exhaust port LEP2 into the casing 10. Then, the control unit CO controls the laser gas supply device 63 to supply a predetermined amount of laser gas through the laser gas supply port LSP2. As a result, the laser gas fills the chamber 70. The control unit CO also controls the motor 79 to rotate the cross flow fan 78. The cross flow fan 78 rotates to circulate the laser gas.
(Step S37)

In this step, the control unit CO maintains the state in step S36 for a predetermined second period T2 after the first auxiliary exhaust valve EV3 and the second auxiliary exhaust valve EV4 for the master oscillator MO are opened and the first auxiliary exhaust valve EV7 and the second auxiliary exhaust valve EV8 for the amplifier PA are further opened in step S35. The second period T2 is, for example, 5 to 10 minutes. Thus, step S36 is performed within the second period T2 after step S35. For example, step S35 and step S36 may be simultaneously performed.

As in step S17 in Embodiment 1, at the time of completion of this step, a difference between a temperature of the first window 33 on the side of the chamber 30 and a temperature thereof on the side of the first optical path tube 51 becomes smaller than that when the amount of the gas flowing on the surface of the first window 33 does not decrease. Also, at the time of completion of this step, a difference between a temperature of the second window 34 on the side of the chamber 30 and a temperature thereof on the side of the second optical path tube 52 becomes smaller than that when the amount of the gas flowing on the surface of the second window 34 does not decrease.

In this step, the amounts of the gases flowing on the surfaces of the first window 73 and the second window 74 for the amplifier PA decrease as described above. Thus, at the time of end of this step, cooling of the first window 73 on the side of the first optical path tube 55 with the gas in the first optical path tube 55 is suppressed, and cooling of the second window 74 on the side of the second optical path tube 56 with the gas in the second optical path tube 56 is suppressed. Thus, at the time of completion of this step, a difference between a temperature of the first window 73 on the side of the chamber 70 and a temperature thereof on the side of the first optical path tube 55 becomes smaller than that when the amount of the gas flowing on the surface of the first window 73 does not decrease. Also, at the time of completion of this step, a difference between a temperature of the second window 74 on the side of the chamber 70 and a temperature thereof on the side of the second optical path tube 56 becomes smaller than that when the amount of the gas flowing on the surface of the second window 74 does not decrease.
(Step S38)

In this step, as in step S18 in Embodiment 1, the control unit CO causes the laser beam to be emitted from the output coupling mirror OC1 in the master oscillator MO. The control unit CO controls the charger 75 and the switch in the pulse power module 76 to apply a high voltage between the electrodes 71, 72. When the high voltage is applied between the electrodes 71, 72, insulation between the electrodes 71, 72 is broken to cause discharge. By energy of the discharge, a laser medium contained in the laser gas between the electrodes 71, 72 is excited. The control unit CO controls the amplifier PA to excite the laser medium between the electrodes 71, 72 before the laser beam is emitted from the master oscillator MO. The laser beam emitted from the output coupling mirror OC1 is reflected by the mirrors 82, 83 in the optical transmission unit 80, and propagates through the rear mirror RM and the second window 74 in the amplifier PA into the chamber 70. The laser beam causes stimulated emission of the excited laser medium between the electrodes 71, 72 and is amplified. Thus, the laser beam having a predetermined wavelength resonates between the output coupling mirror OC2 and the rear mirror RM and is further amplified. Then, part of the laser beam passes through the output coupling mirror OC2 and is emitted from the amplifier PA. The laser beam emitted from the amplifier PA is reflected by the mirrors 92, 93 in the optical transmission unit 90, and emitted through the optical path tube 57, the energy monitor module 20, and the optical path tube 53 and through the laser beam exit window OW.

In this embodiment, the energy monitor module 20 reflects part of the laser beam emitted from the amplifier PA with the beam splitter 22, and the pulse energy sensor 23 outputs, to the control unit CO, a signal according to intensity of energy of the laser beam. The control unit CO controls the chargers 35, 75 and the pulse power modules 36, 76 according to the signal to adjust power of the emitted laser beam.

Second Example

Figure 10:
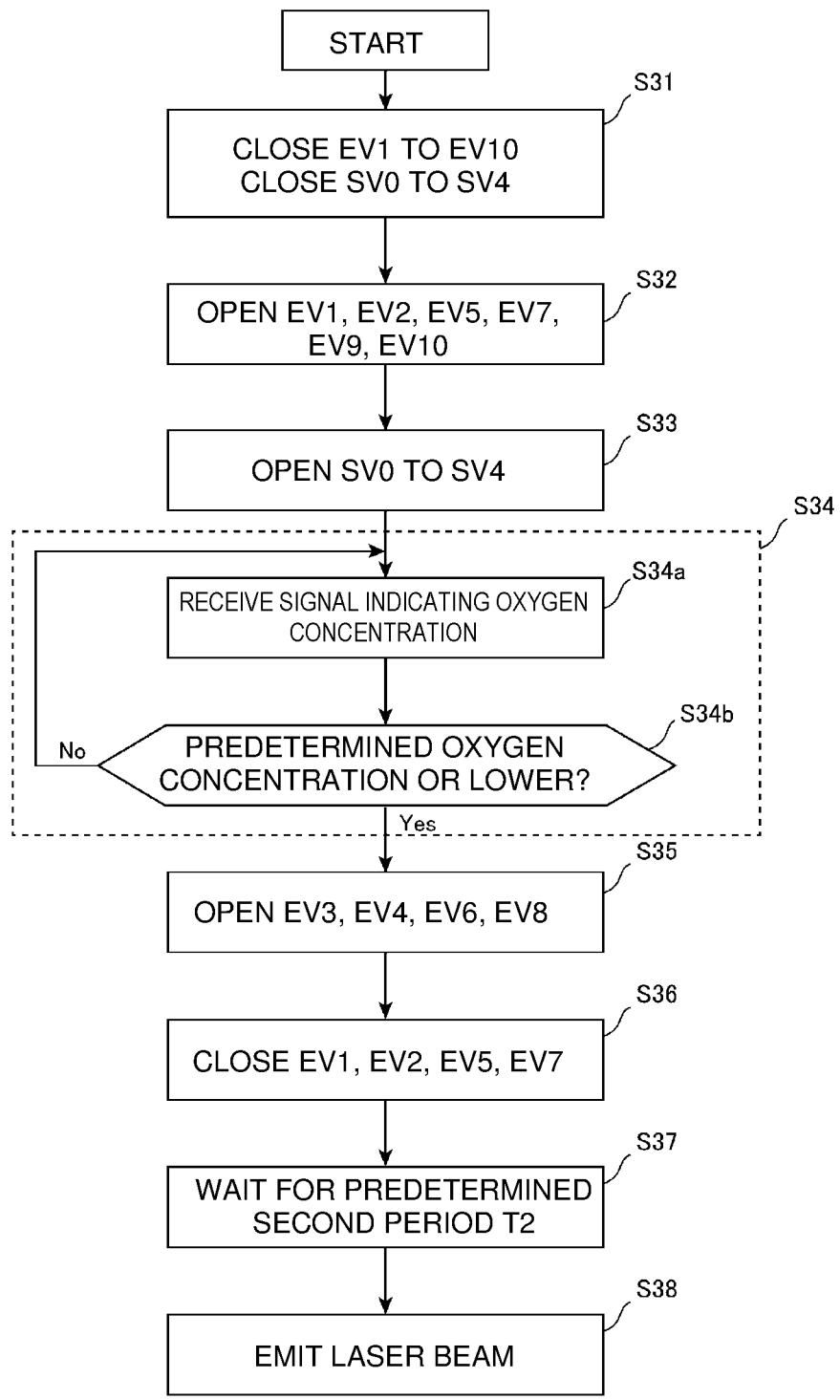
FIG. 10 is a flowchart of a second example of the operation of the control unit until the gas laser apparatus of Embodiment 3 emits the laser beam.

Next, a second example of the operation of the gas laser apparatus 100 of this embodiment will be described. FIG. 10 is a flowchart of a second example of the operation of the control unit CO until the gas laser apparatus 100 of this embodiment emits the laser beam. As shown in FIG. 10, in this example, in the operation of the control unit CO until the laser beam is emitted, step S34 is different from that in the first example, and other steps are the same as those in the first example.
(Step S34)

In this step in this example, the control unit CO maintains the state in step S33 until the oxygen concentration in the first optical path tube 51 and the second optical path tube 52 in the master oscillator MO and the oxygen concentration in the first optical path tube 55 and the second optical path tube 56 in the amplifier PA reach a predetermined first concentration. Thus, step S34 in this example includes step S34a in which the control unit CO receives a signal indicating the oxygen concentration from the oxygen concentration meter 12, and step S34b in which the control unit CO determines whether or not the received oxygen concentration is the predetermined oxygen concentration or lower.
(Step S34a, step S34b)

In this embodiment, in step S34a and step S34b, the control unit CO operates as in step S14a and step S14b in Embodiment 1. However, in this embodiment, in step S34b, when the oxygen concentration is not the predetermined first concentration or lower, the control unit CO returns to step S34a, and when the oxygen concentration is the predetermined first concentration or lower, the control unit CO goes to step S35. In step S35, the first auxiliary exhaust valve EV3 and the second auxiliary exhaust valve EV4 are opened. In this case, the control unit CO does not need to determine that the oxygen concentration in the first optical path tube 51 and the second optical path tube 52 and the oxygen concentration in the first optical path tube 55 and the second optical path tube 56 are the predetermined first concentration or lower.

Also in this embodiment, unlike the above example, the oxygen concentration meter 12 may be provided in the exhaust duct 11. In this case, the control unit CO operates as in the variant in which the oxygen concentration meter 12 is provided in the exhaust duct 11 in the second example of Embodiment 1. However, in the variant of this embodiment, when the oxygen concentration is not a predetermined second concentration or lower in step S34b, the control unit CO returns to step S34a, and when the oxygen concentration is the predetermined second concentration or lower, the control unit CO goes to step S35. Also in this embodiment, when the oxygen concentration in the casing 10 is measured, the oxygen concentration meter 12 may be provided in the casing 10 rather than in the exhaust duct 11.

Also in this embodiment, in the first example, there is no need to measure the oxygen concentration. Thus, when the control unit CO operates as in the first example, the gas laser apparatus 100 does not need to include the oxygen concentration meter 12.

5.3 Effect

With the gas laser apparatus 100 of this embodiment, the beam emitted from the master oscillator MO is amplified by the amplifier PA, thereby allowing the laser beam with higher power to be emitted. As in Embodiment 1, even if the first window 33 in the master oscillator MO is heated when the laser beam is emitted, a smaller thermal shock can be applied on the first window 33 than in the case where the amount of the gas flowing on the surface of the first window 33 does not decrease. Also, even if the second window 34 is heated when the laser beam is emitted, a smaller thermal shock can be applied on the second window 34 than in the case where the amount of the gas flowing on the surface of the second window 34 does not decrease. Further, even if the first window 73 in the amplifier PA is heated when the laser beam is emitted, a smaller thermal shock can be applied on the first window 73 than in the case where the amount of the gas flowing on the surface of the first window 73 does not decrease. Further, even if the second window 74 is heated when the laser beam is emitted, a smaller thermal shock can be applied on the second window 74 than in the case where the amount of the gas flowing on the surface of the second window 74 does not decrease. Thus, the gas laser apparatus of this embodiment can have high durability.

In this embodiment, the chamber 30, the first window 33, the second window 34, the first optical path tube 51, the second optical path tube 52, the first gas supply valve SV1, the second gas supply valve SV2, the first main exhaust valve EV1, the second main exhaust valve EV2, the first main exhaust port EP1, the second main exhaust port EP2, the first auxiliary exhaust port EP3, the second auxiliary exhaust port EP4, the first auxiliary exhaust valve EV3, and the second auxiliary exhaust valve EV4 can be for the master oscillator. In this embodiment, the chamber 70, the first window 73, the second window 74, the first optical path tube 55, the second optical path tube 56, the first gas supply valve SV3, the second gas supply valve SV4, the first main exhaust valve EV5, the second main exhaust valve EV6, the first main exhaust port EP5, the second main exhaust port EP6, the first main exhaust valve EV5, the second main exhaust valve EV6, the first auxiliary exhaust port EP7, and the second auxiliary exhaust port EP8 can be for the amplifier.

In this embodiment, the master oscillator MO may be constituted by a different laser device such as a fiber laser device. The amplifier PA does not need to include the rear mirror and the output coupling mirror OC2. In this case, the beam does not resonate in the amplifier PA, but the laser beam passes through the chamber 70 and is amplified.

In this embodiment, as in Embodiment 1, when the gases are exhausted through the first auxiliary exhaust port EP3 and the second auxiliary exhaust port EP4, the gases may also be exhausted through the first main exhaust port EP1 and the second main exhaust port EP2. In this case, for example, when the gases are exhausted through first auxiliary exhaust port EP3 and the second auxiliary exhaust port EP4, the amounts of the gases exhausted through the first main exhaust port EP1 and the second main exhaust port EP2 may be smaller than those before the gases are exhausted through the first auxiliary exhaust port EP3 and the second auxiliary exhaust port EP4. Also, when the gases are exhausted through the first auxiliary exhaust port EP7 and the second auxiliary exhaust port EP8, the gases may also be exhausted through the first main exhaust port EP5 and the second main exhaust port EP6. In this case, for example, when the gases are exhausted through the first auxiliary exhaust port EP7 and the second auxiliary exhaust port EP8, the amounts of the gases exhausted through the first main exhaust port EP5 and the second main exhaust port EP6 may be smaller than those before the gases are exhausted through the first auxiliary exhaust port EP7 and the second auxiliary exhaust port EP8.

In this embodiment, as in Embodiment 1, if the gases are exhausted through the first auxiliary exhaust port EP3 and the second auxiliary exhaust port EP4 in at least a partial period when emission and stop of the laser beam are repeated, the thermal shock applied on the first window 33 and the second window 34 can be further reduced at the emission and the stop of the laser beam in at least that period. Thus, the control unit CO may start the exhaust of the gases through the first auxiliary exhaust port EP3 and the second auxiliary exhaust port EP4 after the laser beam is emitted. Also, if the gases are exhausted through first auxiliary exhaust port EP7 and the second auxiliary exhaust port EP8 in at least the partial period when the emission and the stop of the laser beam are repeated, the thermal shock applied on the first window 73 and the second window 74 can be further reduced at the emission and the stop of the laser beam in at least that period. Thus, the control unit CO may start the exhaust of the gases through the first auxiliary exhaust port EP7 and the second auxiliary exhaust port EP8 of the amplifier PA after the laser beam is emitted.

In this embodiment, the control unit CO may cause the laser beam to be emitted from the chamber 30 before elapse of the predetermined second period T2 from the start of the exhaust of the gases through first auxiliary exhaust port EP3, the second auxiliary exhaust port EP4, the first auxiliary exhaust port EP7, and the second auxiliary exhaust port EP8.

The first main exhaust port EP5 is provided in a position such that when the gas is exhausted through the first main exhaust port EP5, the gas flows on the surface of the first window 73. As long as the first main exhaust port EP5 is provided in such a position, the first main exhaust port EP5 may be provided on the side of the plane opposite to the chamber 70, the plane extending along the first window 73 and perpendicular to the traveling direction of the laser beam in the first optical path tube 51. The first window 73 does not need to protrude into the first optical path tube 55. Also, the second main exhaust port EP6 is provided in a position such that the gas flows on the surface of the second window 74 when the gas is exhausted through the second main exhaust port EP6. As long as the second main exhaust port EP6 is provided in such a position, the second main exhaust port EP6 may be provided on the side of the plane opposite to the chamber 70, the plane extending along the second window 74 and perpendicular to the traveling direction of the laser beam in the second optical path tube 56. The second window 74 does not need to protrude into the second optical path tube 56.

6. Description of Gas Laser Apparatus of Embodiment 4

Next, a gas laser apparatus of Embodiment 4 will be described. The same components as those described above are denoted by the same reference numerals, and overlapping descriptions are omitted unless otherwise stated.

6.1 Configuration

Figure 11:
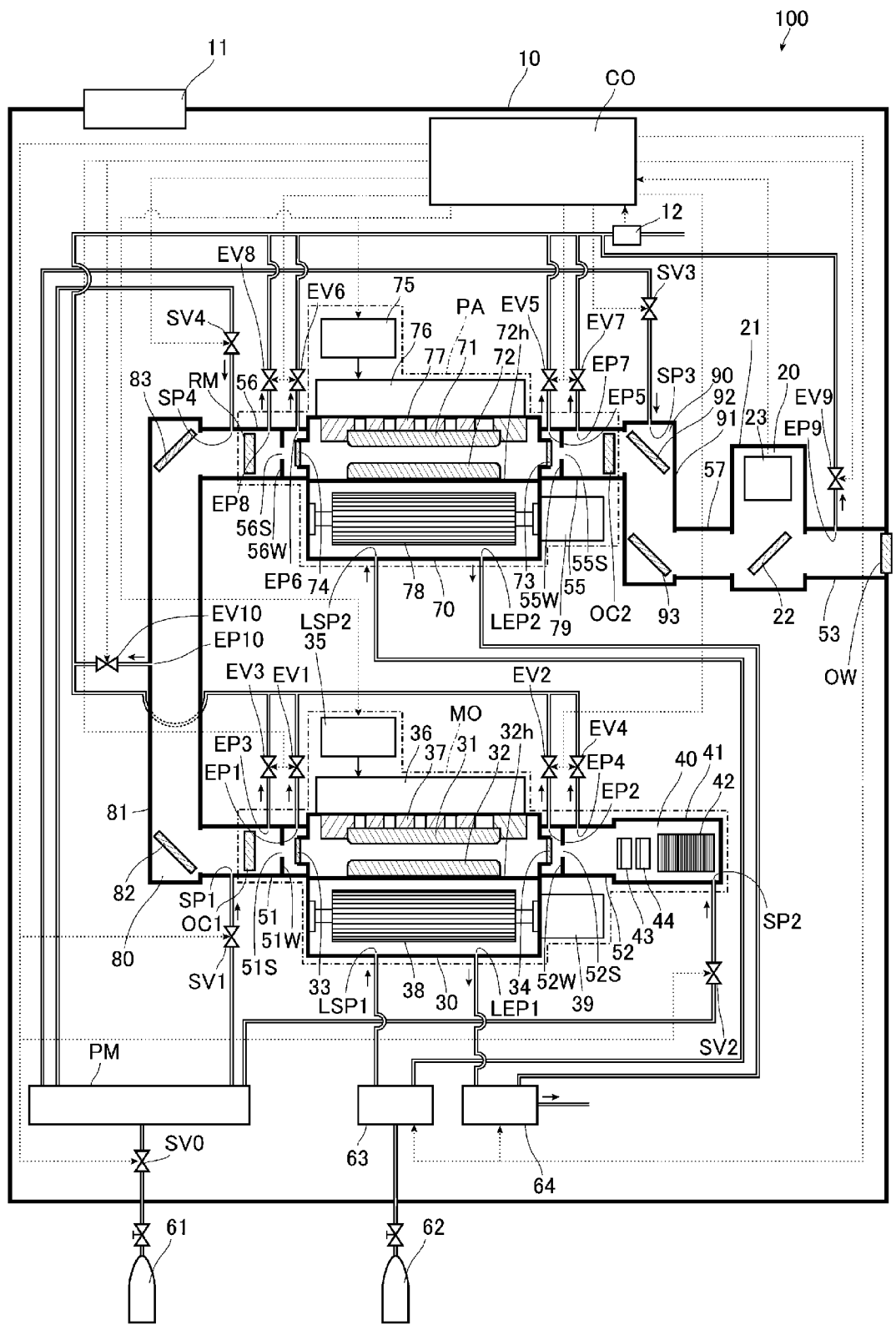
FIG. 11 is a schematic diagram of an exemplary configuration of the entire gas laser apparatus of Embodiment 4.

FIG. 11 is a schematic diagram of an exemplary configuration of the entire gas laser apparatus of this embodiment. As shown in FIG. 11, the gas laser apparatus 100 of this embodiment is different from the gas laser apparatus of Embodiment 3 in that the master oscillator MO includes a first wall 51W and a second wall 52W and that the amplifier PA includes a first wall 55W and a second wall 56W.

Configurations of the first wall 51W and the second wall 52W in the master oscillator MO are the same as those of the first wall 51W and the second wall 52W in Embodiment 2.

The first wall 55W in the amplifier PA is provided between the first main exhaust port EP5 and the first auxiliary exhaust port EP7 in the first optical path tube 55, and closes the first optical path tube 55. The first wall 55W has a first slit 55S. The first slit 55S is formed such that the laser beam propagating between the first window 73 and the output coupling mirror OC2 can pass through the first slit 55S. The first slit 55S preferably has a shape substantially similar to a sectional shape of the laser beam passing through the first slit 55S such that the first slit 55S has no unnecessary region.

The second wall 56W in the amplifier PA is provided between the second main exhaust port EP6 and the second auxiliary exhaust port EP8 in the second optical path tube 56, and closes the second optical path tube 56. The second wall 56W has a second slit 56S. The second slit 56S is formed such that the laser beam propagating between the second window 74 and the rear mirror RM can pass through the second slit 56S. The second slit 56S preferably has a shape substantially similar to a sectional shape of the laser beam passing through the second slit 56S such that the second slit 56S has no unnecessary region.

The first wall 55W and the second wall 56W are made of, for example, the same material as the material for the first wall 51W and the second wall 52W.

6.2 Operation

An operation of the gas laser apparatus 100 of this embodiment is the same as that of the gas laser apparatus 100 of Embodiment 3. However, when the gas is exhausted through the first main exhaust port EP1 for the master oscillator, the gas in the first optical path tube 51 flows through the first slit 51S and on the surface of the first window 33, and is exhausted through the first main exhaust port EP1. Also, when the gas is exhausted through the second main exhaust port EP2, the gas in the second optical path tube 52 flows through the second slit 52S and on the surface of the second window 34, and is exhausted through the second main exhaust port EP2. Further, when the gas is exhausted through the first main exhaust port EP5 for the amplifier PA, the gas in the first optical path tube 55 flows through the first slit 55S and on the surface of the first window 73, and is exhausted through the first main exhaust port EP5. Further, when the gas is exhausted through the second main exhaust port EP6, the gas in the second optical path tube 56 flows through the second slit 56S and on the surface of the second window 74, and is exhausted through the second main exhaust port EP6.

6.3 Effect

In the gas laser apparatus 100 of this embodiment, as in Embodiment 2, when the gases are exhausted through the first auxiliary exhaust port EP3 and the second auxiliary exhaust port EP4 for the master oscillator MO, flowing of the gases to the first window 33 and the second window 34 can be suppressed. Also, the first wall 55W in the amplifier PA can serve as a barrier to suppress flowing of the gas to the first window 73 when the gas is exhausted through the first auxiliary exhaust port EP7. Further, the second wall 56W can serve as a barrier to suppress flowing of the gas to the second window 74 when the gas is exhausted through the second auxiliary exhaust port EP8. This can further reduce the thermal shock applied on the first window 33, the second window 34, the first window 73, and the second window 74.

The gas laser apparatus 100 of this embodiment may include at least one of the first wall 51W, the second wall 52W, the first wall 55W, and the second wall 56W. The gas laser apparatus 100 preferably includes the first wall 55W because the power of the laser beam passing through the first window 73 in the amplifier PA is higher than that of the laser beam passing through other windows.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A gas laser apparatus comprising:
   a chamber filled with a laser gas;
   a window provided in the chamber and allowing a laser beam to pass therethrough;
   an optical path tube connected to the chamber to surround a position of the window in the chamber;
   a gas supply port configured to supply a purge gas into the optical path tube;
   an exhaust port configured to exhaust a gas in the optical path tube; and
   a control unit,
   the exhaust port including a main exhaust port provided in the optical path tube such that the gas flows on a surface of the window, and an auxiliary exhaust port provided in the optical path tube upstream of a flow of the gas in the optical path tube with respect to the position of the window and a position of the main exhaust port,
   the control unit causing the gas to be exhausted through the main exhaust port before the laser beam is emitted from the chamber and causing the gas to be exhausted through the auxiliary exhaust port in at least a partial period when the laser beam is emitted from the chamber,
   the control unit causes the gas to be exhausted through the auxiliary exhaust port when the exhaust of the gas through the main exhaust port is started and an oxygen concentration in the optical path tube reaches a predetermined first concentration or lower, further comprising a casing that houses the chamber and the optical path tube and into which the gas from the exhaust port is released, wherein the control unit causes the gas to be exhausted through the auxiliary exhaust port when an oxygen concentration in the casing reaches a predetermined second concentration or lower, and the second concentration is the oxygen concentration in the casing when the oxygen concentration in the optical path tube is the predetermined first concentration or lower.

2. A gas laser apparatus comprising:

a chamber filled with a laser gas;

a window provided in the chamber and allowing a laser beam to pass therethrough;

an optical path tube connected to the chamber to surround a position of the window in the chamber;

a gas supply port configured to supply a purge gas into the optical path tube;

an exhaust port configured to exhaust a gas in the optical path tube; and a control unit, the exhaust port including a main exhaust port provided in the optical path tube such that the gas flows on a surface of the window, and an auxiliary exhaust port provided in the optical path tube upstream of a flow of the gas in the optical path tube with respect to the position of the window and a position of the main exhaust port, the control unit causing the gas to be exhausted through the main exhaust port while supplying the purge gas before the laser beam is emitted from the chamber and causing the gas to be exhausted while supplying the purge gas only through the auxiliary exhaust port in at least a partial period when the laser beam is emitted from the chamber.

3. The gas laser apparatus according to claim 2, wherein the main exhaust port is provided adjacent to the window.

4. The gas laser apparatus according to claim 2, wherein the control unit stops the exhaust of the gas through the main exhaust port when the gas is exhausted through the auxiliary exhaust port.

5. The gas laser apparatus according to claim 2, wherein the control unit causes the gas to be exhausted through the auxiliary exhaust port after a predetermined first period from start of the exhaust of the gas through the main exhaust port.

6. The gas laser apparatus according to claim 2, wherein the control unit causes the laser beam to be emitted from the chamber after the exhaust of the gas through the auxiliary exhaust port is started.

7. The gas laser apparatus according to claim 6, wherein the control unit causes the laser beam to be emitted from the chamber after a predetermined second period from start of the exhaust of the gas through the auxiliary exhaust port.

8. The gas laser apparatus according to claim 2, wherein the position of the window in the chamber protrudes into the optical path tube with a gap from an inner wall of the optical path tube, and the main exhaust port is provided in a position including a plane extending along the window and perpendicular to a traveling direction of the laser beam in the optical path tube, or a position closer to the chamber than the plane in the optical path tube.

9. The gas laser apparatus according to claim 2, wherein an optical element that the laser beam enters is arranged upstream of the flow of the gas with respect to the auxiliary exhaust port.

10. The gas laser apparatus according to claim 2, further comprising:

a main exhaust valve provided downstream of the main exhaust port, and an auxiliary exhaust valve provided downstream of the auxiliary exhaust port.

* * * * *